(12) United States Patent
Kim et al.

(10) Patent No.: US 11,562,794 B2
(45) Date of Patent: Jan. 24, 2023

(54) STORAGE DEVICE PERFORMING READ OPERATION BY USING TIME INTERLEAVED SAMPLING PAGE BUFFER

(71) Applicant: SAMSUNG ELECTRONICS CO., LTD., Suwon-si (KR)

(72) Inventors: Jisu Kim, Hwaseong-si (KR); Hyunggon Kim, Hwaseong-si (KR); Sangsoo Park, Hwaseong-si (KR); Joonsuc Jang, Hwaseong-si (KR); Minseok Kim, Hwaseong-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 0 days.

(21) Appl. No.: 17/324,333

(22) Filed: May 19, 2021

(65) Prior Publication Data
US 2022/0093184 A1    Mar. 24, 2022

(30) Foreign Application Priority Data

Sep. 18, 2020  (KR) .................. 10-2020-0120310

(51) Int. Cl.
*G06F 11/10* (2006.01)
*G06F 11/07* (2006.01)
(Continued)

(52) U.S. Cl.
CPC .......... *G11C 16/26* (2013.01); *G06F 11/1068* (2013.01); *G11C 11/5642* (2013.01); *G11C 11/5671* (2013.01); *G11C 16/0483* (2013.01); *G11C 16/24* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ......... G11C 16/26; G11C 11/56; G11C 16/04; G11C 16/24; G06F 11/10; H01L 23/00; H01L 25/065; H01L 25/18
See application file for complete search history.

(56) References Cited

U.S. PATENT DOCUMENTS 9,431,123 B2    8/2016  Kim
10,019,188 B2   7/2018  Chung et al.
(Continued)

FOREIGN PATENT DOCUMENTS

KR    1020160101751    8/2016
KR    1020190025359    3/2019

OTHER PUBLICATIONS

ESSR dated Feb. 23, 2022 in corresponding EP Patent Application No. 21184509.4.

*Primary Examiner* — Guy J Lamarre
(74) *Attorney, Agent, or Firm* — F. Chau & Associates, LLC

(57) ABSTRACT

Provided is a storage device that performs a read operation by using a time interleaved sampling page buffer. The storage device controls a sensing point in time, when bit lines of even page buffer circuits are sensed, and a sensing point in time, when bit lines of odd page buffer circuits are sensed, with a certain time difference, and performs an Even Odd Sensing (EOS) operation in a stated order of even sensing and odd sensing. The storage device performs a two-step EOS operation and performs a main sensing operation on a selected memory cell according to a result of the two-step EOS operation.

18 Claims, 22 Drawing Sheets

(51) Int. Cl.
*G06F 11/30* (2006.01)
*G06F 11/14* (2006.01)
*G11C 16/26* (2006.01)
*G11C 11/56* (2006.01)
*G11C 16/04* (2006.01)
*G11C 16/24* (2006.01)
*H01L 23/00* (2006.01)
*H01L 25/065* (2006.01)
*H01L 25/18* (2006.01)

(56) References Cited

U.S. PATENT DOCUMENTS

| | | |
|---|---|---|
| 10,325,664 B2 | 6/2019 | Tokutomi et al. |
| 10,388,384 B2 | 8/2019 | Vali et al. |
| 10,431,299 B2 | 10/2019 | Tokutomi et al. |
| 10,629,259 B2 | 4/2020 | Jang |
| 10,823,814 B2 | 11/2020 | Kang et al. |
| 2009/0323412 A1* | 12/2009 | Mokhlesi ............ G11C 11/5642 365/185.02 |
| 2011/0090740 A1 | 4/2011 | Lee et al. |
| 2017/0133087 A1 | 5/2017 | Park et al. |
| 2018/0204624 A1* | 7/2018 | Yoon .................... G11C 29/028 |
| 2019/0259459 A1 | 8/2019 | Tokutomi et al. |
| 2019/0267102 A1 | 8/2019 | Vali et al. |
| 2019/0362783 A1 | 11/2019 | Tokutomi et al. |
| 2020/0090766 A1 | 3/2020 | Tokutomi et al. |
| 2020/0090779 A1 | 3/2020 | Tokutomi et al. |
| 2020/0098436 A1* | 3/2020 | Kim ................... G06F 11/1048 |
| 2020/0286545 A1 | 9/2020 | Yoon |

* cited by examiner

STORAGE DEVICE PERFORMING READ OPERATION BY USING TIME INTERLEAVED SAMPLING PAGE BUFFER

CROSS-REFERENCE TO RELATED APPLICATION

This U.S. non-provisional patent application claims the benefit of priority under 35 U.S.C. § 119 to Korean Patent Application No. 10-2020-0120310, filed on Sep. 18, 2020, in the Korean Intellectual Property Office, the disclosure of which is incorporated by reference in its entirety herein.

TECHNICAL FIELD

The inventive concept relates to a semiconductor memory device, and more particularly, to a storage device performing a read operation by using a time interleaved sampling page buffer and an operation method of the storage device.

DISCUSSION OF RELATED ART

A data processing system such as a data center is hosted by many companies and their computer systems. A data center is used to distribute hosted applications and/or transactions and includes networked computer resources such as servers, disks, and virtual machines. In such a configuration, enterprises are clients of the data center. The data center provides clients with a number of services that may reduce costs and decrease management burden.

The data center may use Dynamic Random Access Memory (DRAM) to store data or instructions used by a host included in the data center and/or to perform computational operations. The data center may also include a storage device with a non-volatile memory. As the capacity of the storage device increases, the number of memory cells and word lines that are three-dimensionally stacked on a substrate of the non-volatile memory increases, and the number of bits of data stored in a given memory cell increases as well.

The non-volatile memory may deteriorate over time due to various reasons. The storage device may overcome the deterioration by changing operation conditions of the non-volatile memory. The changed operation conditions may be set in advance in the storage device, based on average usage patterns and use environments. However, such techniques are inappropriate when a threshold voltage distribution of the memory cells shift.

Accordingly, depending on a deterioration degree of the non-volatile memory, there is a need to change the operation conditions dynamically.

SUMMARY

According to an exemplary embodiment of the inventive concept, there is provided a method of reading a non-volatile memory device, the method including performing a first sensing operation on a selected memory cell connected to a selected word line and applying a first read voltage to the selected word line, wherein the first sensing operation is performed by separating a plurality of memory cells, which are connected to the selected word line, into a first group and a second group, determining a first valley search operation and a target read level of the first read voltage according to a result of the performing of the first sensing operation, performing a second sensing operation on the selected memory cell and applying, to the selected word line, a second read voltage having a different target read level from the first read voltage, wherein the second sensing operation is performed by separating the plurality of memory cells into the first group and the second group, performing a second valley search operation according to a result of the performing of the second sensing operation, determining a target develop point in time of a sensing node connected to the selected memory cell, according to a result of the performing of the second valley search operation, and performing a main read operation on the selected memory cell by using the target read level and the target develop point in time.

According to an exemplary embodiment of the inventive concept, there is provided a method of reading data from a selected memory cell of a non-volatile memory device, the method including performing a two-step Even Odd Sensing (EOS) operation on the selected memory cell, performing a first main sensing operation on the selected memory cell, according to a result of the two-step EOS operation, performing a one-step EOS operation on the selected memory cell, and performing a second main sensing operation on the selected memory cell, according to a result of the one-step EOS operation, wherein the two-step EOS operation is performed to identify program states that have shifted more than a first threshold amount according to a retention deterioration from among program states of the plurality of memory cells, and the one-step EOS operation is performed to identify program states that have shifted less a second threshold amount according to the retention deterioration from among the program states of the plurality of memory cells.

According to an exemplary embodiment of the inventive concept, there is provided an operation method of a storage device including a non-volatile memory device and a controller that controls the non-volatile memory device. The method includes transmitting a read command from the controller to the non-volatile memory device, performing a read operation on the non-volatile memory device according to the read command and transmitting read data of the read operation to the controller, performing, by the controller, an Error Correction Code (ECC) operation on the read data, performing a two-step Even Odd Sensing (EOS) operation on the non-volatile memory device when a result of the ECC operation indicates error correction of the read data is not possible, and determining optimum read levels of a valley for reading data stored in the non-volatile memory device, according to a result of the performing of the two-step EOS operation.

According to an exemplary embodiment of the inventive concept, there is provided an operation method of a storage device including a plurality of memory blocks. The method includes: upon detecting a sudden power off of the storage device while first data is being written to first memory block from among a plurality of memory blocks and successive writing of the first data to the first memory block is unable to be performed, selecting a second memory block as a Power Loss Protection (PLP) area, and migrating the first data written on the first memory block to the second memory block that is the PLP area. The migrating includes performing a two-step Even Odd Sensing (EOS) operation on the selected memory cell, and performing a main sensing operation on the selected memory cell to read the first data, according to a result of the performing of the two-step EOS operation.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
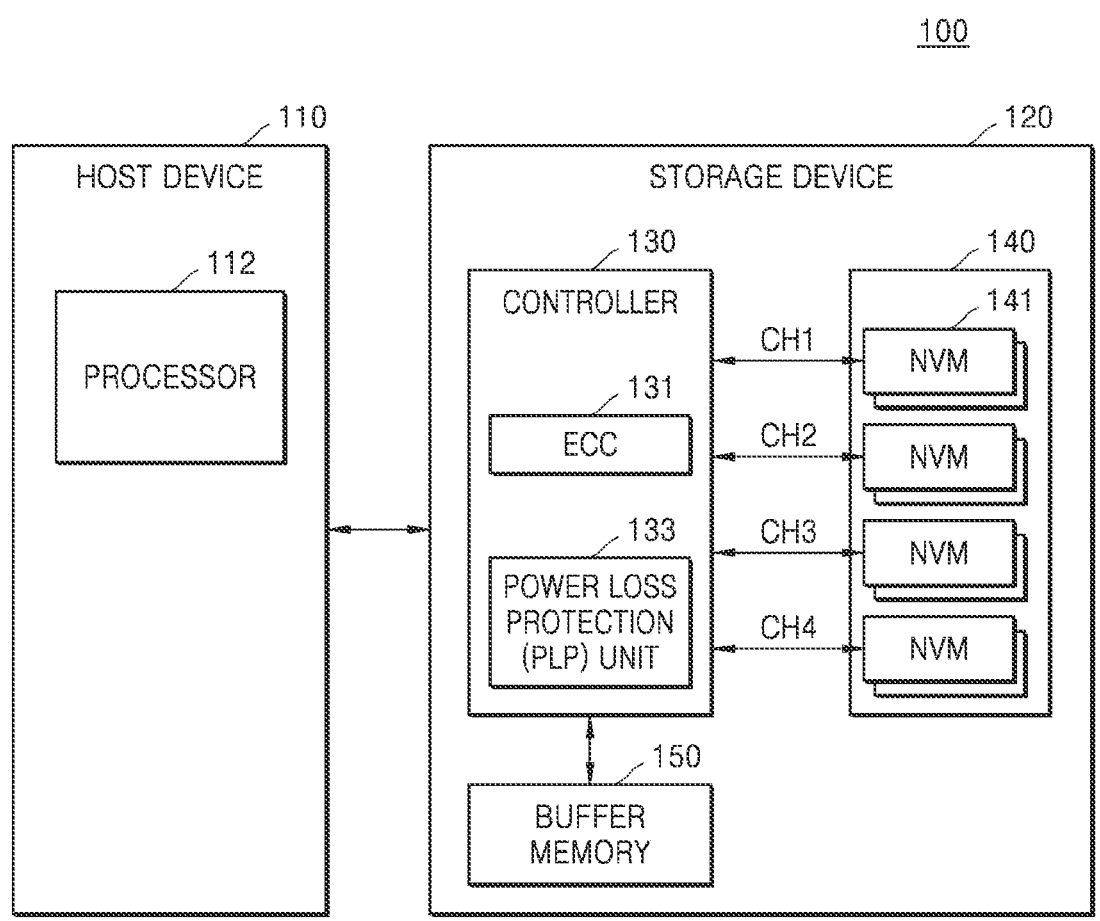
FIG. 1 is a conceptual block diagram of a system according to an exemplary embodiment of the inventive concept.

FIG. 1 is a conceptual block diagram of a system according to an exemplary embodiment of the inventive concept.

Referring to FIG. 1, the system 100 may be a data center including tens of host machines or servers running hundreds of virtual machines. According to some embodiments, the system 100 may be, for example, computing devices such as a laptop computer, a desktop computer, a server computer, a workstation, a portable communication terminal, a Personal Digital Assistant (PDA), a Portable Multimedia Player (PMP), a smart phone, a tablet PC, a virtual machine, or a virtual computing device of the virtual machine. Alternatively, the system 100 may be part of components included in a computing system such as a graphics card.

The system 100 may include hardware components described below in detail with reference to FIG. 1, but one or more embodiments of the inventive concept are not limited thereto. The system 100 may include other components. In an embodiment, the system 100 includes a host device 110 and a storage device 120. The host device 110 and the storage device 120 may communicate with each other by using various protocols. For example, the host device 110 and the storage device 120 may communicate with each other by using interface protocols such as Peripheral Component Interconnect-Express (PCI-E), Advanced Technology Attachment (ATA), Serial ATA (SATA), Parallel ATA (PATA), or serial attached SCSI (SAS). In addition, other interface protocols such as Universal Flash Storage (UFS), Universal Serial Bus (USB), Multi-Media Card (MMC), Enhanced Small Disk Interface (ESDI), and Integrated Drive Electronics (IDE) may be used an interface protocol between the host device 110 and the storage device 120.

The host device 110 may control a data processing operation to be performed on the storage device 120. For example, the data processing operation may be a data read operation, a data write operation, or a data erase operation. The host device 110 may be a data processor that processes data. For example, the data processor may be a processor 112, a Central Processing Unit (CPU), a microprocessor, or an Application Processor (AP). The host device 110 may execute an operating system (OS) and/or various applications. In an embodiment, the system 100 may be included in a mobile device, and the host device 110 may be realized as an AP. In an embodiment, the host device 110 may be realized as a System-On-a-Chip (SoC) and thus may be embedded in the system 100.

Some examples may be described using the expressions such as "connected" and/or "coupled" together with their derivatives. These terms are not necessarily used as synonyms for each other. For example, descriptions using the terms "connected" and/or "coupled" may indicate that two or more elements directly physically or electrically contact each other. The terms "connected" and/or "coupled" may also indicate that two or more elements still cooperate or interact with each other even though they do not directly contact each other.

For example, the processor 112 may include a CPU, a Graphics Processing Unit (GPU), a Neural Processing Unit (NPU), or a Digital Signal Processor (DSP). The number of processors 112 may be at least one, that is, a multicore processor. The processor 112 may be configured to execute one or more machine-executable commands or software, firmware, or a combination thereof. FIG. 1 illustrates the system 100 including one processor 112, but according to an embodiment, the system 100 may include multiple processors.

The storage device 120 may include a controller 130, a non-volatile memory 140, and a buffer memory 150. For example, the storage device 120 may include a Solid State Drive or Solid State Disk (SSD), Universal Flash Storage (UFS), a memory card, a micro SD card, or an embedded Multi-Media (eMMC) card, but the scope of the inventive concept is not limited thereto.

The controller 130 may process a request from the host device 110. The controller 130 may perform a write operation (or a program operation), a read operation, and an erase operation on the non-volatile memory 140, according to the request from the host device 110. The controller 130 may control the non-volatile memory 140 and the buffer memory 150. The controller 130 may be realized by using a SoC, an Application Specific Integrated Circuit (ASIC), or a Field Programmable Gate Array (FPGA).

The non-volatile memory 140 may perform a write operate, a read operation, and an erase operation, according to the control of the controller 130. The non-volatile memory 140 may include non-volatile memory devices (hereinafter, referred to as "NVM devices") connected to channels CH1 to CH4, respectively. Each NVM device may include a NAND flash memory.

The NVM devices may be connected to the controller 130 through the channels CH1 to CH4. FIG. 1 illustrates that the number of channels is four, but one or more embodiments of the inventive concept are not limited thereto. Each NVM device may receive a write command, an address, and data from the controller 130 and write data to the memory cells corresponding to the address. Each NVM device may receive a read command and an address from the controller 130, read the data from the memory cells corresponding to the address, and output the read data to the controller 130. Each NVM device may receive an erase command and an address from the controller 130 and erase data of the memory cells corresponding to the address. The NVM devices will be described in more detail with reference to FIG. 2.

The controller 130 may drive each memory block included in the NVM device in one of a single level cell (SLC) mode, a multi-level cell (MLC) mode, a triple level cell (TLC) mode, and a quad-level cell (QLC) mode. The controller 130 may include an Error Correction Code (ECC) unit 131 and a Power Loss Protection (PLP) unit 133. The ECC unit 131 may be referred to as an ECC engine or an ECC circuit block.

The ECC unit 131 may detect and correct errors of data input from the host device 110 or data output from each NVM device and may provide accurate data.

When the storage device 120 suddenly powers off, the PLP unit 133 may perform a PLP operation to complete the request from the host device 110 by using auxiliary power of the storage device 120. A component described herein as a unit may be implemented as a circuit or a processor.

The buffer memory 150 may include Static Random Access Memory (SRAM), Dynamic Random Access Memory (DRAM), or Tightly Coupled Memory (TCM). Unlike the illustration of FIG. 1, the buffer memory 150 may be embodied inside the controller 130. In an embodiment, the capacity of the buffer memory 150 is less than that of the non-volatile memory 140. In an embodiment, the buffer memory 150 has at least one of a latency time, an access time, and an operation speed that are better as compared to those of the non-volatile memory 140. The buffer memory 150 may store information or a program for controlling or managing the non-volatile memory 140, a mapping table indicating a relationship between a logical address of a host and a physical address of the non-volatile memory 140, data to be stored in the non-volatile memory 140, or data output from the non-volatile memory 140.

Figure 2:
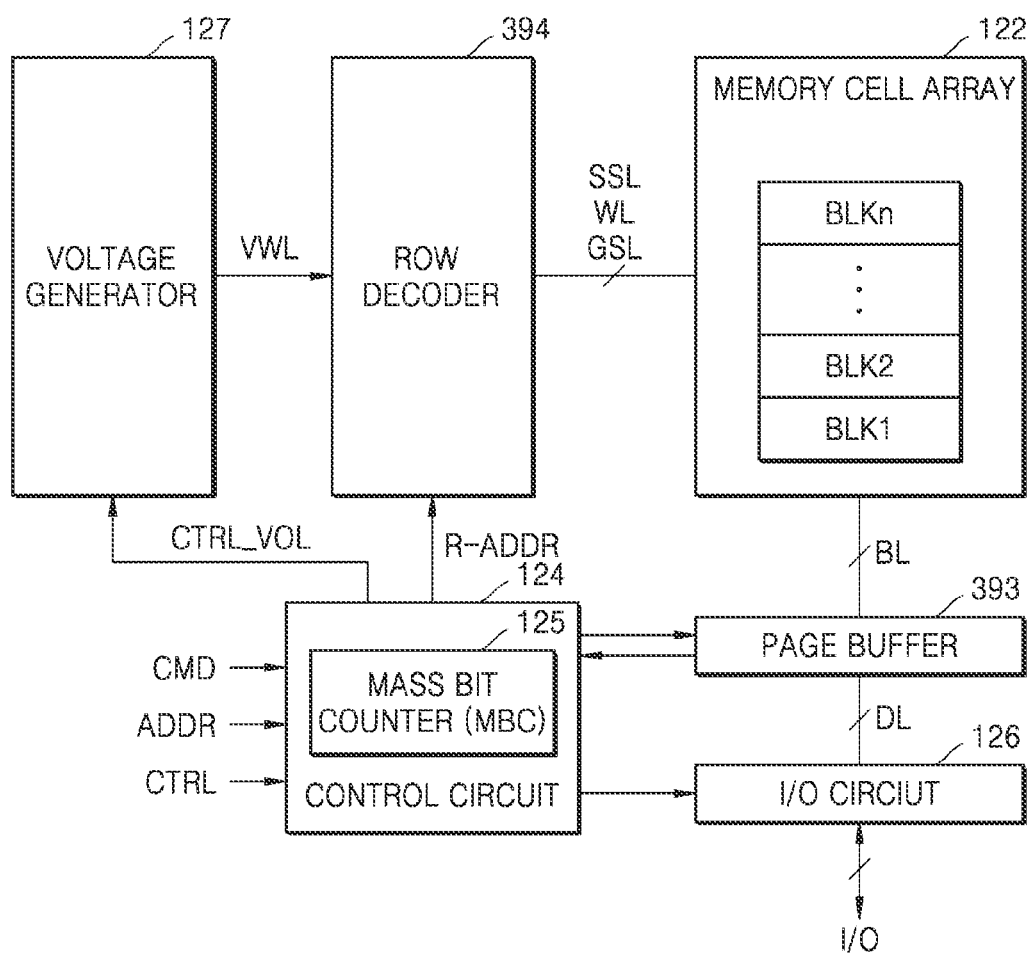
FIG. 2 is a block diagram of an example of a non-volatile memory device of FIG. 1.

FIG. 2 is a block diagram of an example of the NVM device of FIG. 1. Referring to FIG. 2, one NVM device 141 from among the NVM devices will be described.

Referring to FIG. 2, the NVM device 141 includes a memory cell array 122, a row decoder 394 (e.g., a decoder circuit), a control circuit 124, a page buffer 393, an input/output circuit 126, and a voltage generator 127. Although not illustrated, the NVM device 141 may further include an input/output interface.

The memory cell array 122 may be connected to word lines WL, string selection lines SSL, ground selection lines GSL, and bit lines BL. The memory cell array 122 may be connected to the row decoder 394 through the word lines WL, the string selection lines SSL, and the ground selection lines GSL and may be connected to the page buffer 393 through the bit lines BL. The memory cell array 122 may include memory blocks BLK1 to BLKn.

Each of the memory blocks BLK1 to BLKn may include memory cells and selection transistors. The memory cells may be connected to the word lines WL, and the selection transistors may be connected to the string selection lines SSL or the ground selection lines GSL. The memory cells of each of the memory blocks BLK1 to BLKn may each be an SLC, an MLC, a TLC, or a QLC under the control of the controller 130. Hereinafter, embodiments of the inventive concept will be described by referring to an example in which the memory cells are NAND flash memory cells. The memory cell array 122 may include a three-dimensional memory cell array including cell strings, which will be described with reference to FIGS. 3 and 4.

The three-dimensional memory cell array is monolithically formed on at least one physical level of memory cell arrays each including an active area on a silicon substrate and a circuit formed on or in the substrate for the operation of the memory cell. The term "monolithic" may indicate that layers at each level forming the array are directly stacked on layers of each lower layer of the array. In an embodiment, the three-dimensional memory cell array includes cell strings that are vertically arranged to make at least one memory cell be located on another memory cell. The at least one memory cell may include a charge trap layer. U.S. Pat. Nos. 7,679,133, 8,553,466, 8,654,587, 8,559,235, and US 2011/0233648 disclose that a three-dimensional memory array is configured in levels, and word lines and/or bit lines are shared between the levels, and the disclosures thereof are herein incorporated by reference.

The row decoder 394 may select one of the memory blocks BLK1 to BLKn of the memory cell array 122, select one of the word lines WL of the selected memory block, and select one of the string selection lines SSL.

The control circuit 124 may output various internal control signals for performing a program operation, a read operation, and an erase operation on the memory cell array 122, according to a command CMD, an address ADDR, and a control signal CTRL transmitted from the controller 130. The control circuit 124 may provide a row address R_ADDR to the row decoder 394, a column address to the input/output circuit 126, and a voltage control signal CTRL_VOL to the voltage generator 127.

In an exemplary embodiment, the control circuit 124 includes a counter 125 (e.g., a counting circuit) that counts the number of memory cells sensed according to a two-step EOS read operation to search for a valley location of a threshold voltage of the memory cell. The counter 125 may count mass bits and may be referred to as a mass bit counter (MBC). In embodiments below, the terms of counter 125 and MBC may be interchangeably used.

The page buffer 393 may function as a write driver or a detection amplifier according to an operation mode. During the read operation, the page buffer 393 may sense the bit line BL of the selected memory cell, according to the control of the control circuit 124. The sensed data may be stored in a latch included in the page buffer 393. The page buffer 393 may provide the MBC 125 with the data stored in the latch, according to the control of the control circuit 124. Also, the page buffer 393 may dump the data, which is stored in the latch, to the input/output circuit 126 through the data line DL, according to the control of the control circuit 124.

The input/output circuit 126 may temporarily store the command CMD, the address ADDR, and the data DATA provided from the outside of the NVM device 141 through an input/output line I/O. The input/output circuit 126 may temporarily store read data of the NVM device 141 and output the read data to the outside through the input/output line I/O at a designated point in time.

The voltage generator 127 may generate various voltages for performing the program operation, the read operation, and the erase operation on the memory cell array 122, in response to the voltage control signal CTRL_VOL. In detail, the voltage generator 127 may generate a word line voltage VWL, for example, a program voltage, a detection read voltage, a read voltage, a pass voltage, an erase voltage, or an erase verification voltage.

Figure 3:
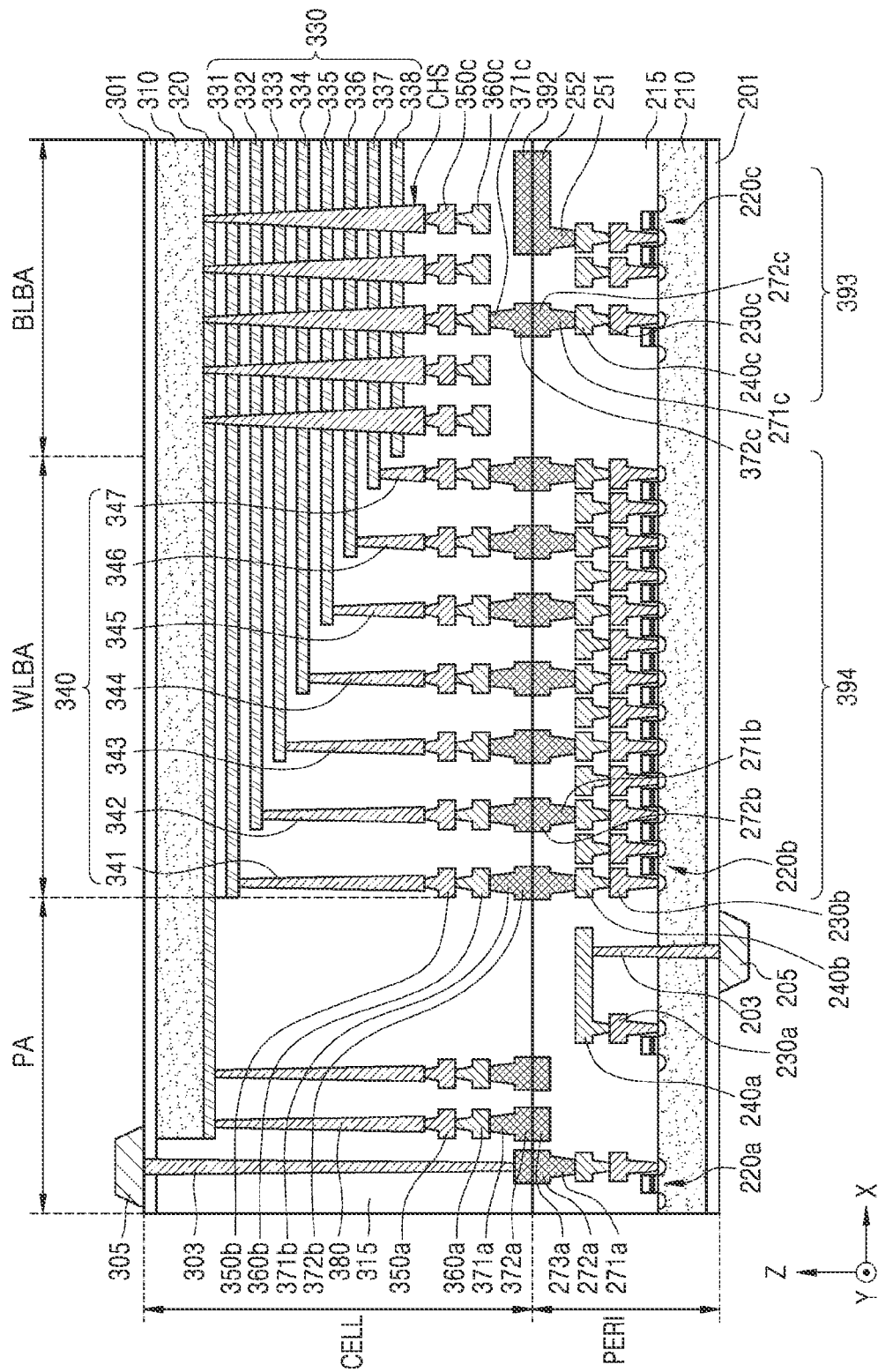
FIG. 3 is a diagram of a structure of an NVM device of FIG. 2.

FIG. 3 is a diagram illustrating a memory device 141 of FIG. 2 according to an example embodiment.

Referring to FIG. 3, a memory device 141 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, separate from the first wafer, and then bonding the upper chip and the lower chip to each other. Here, the bonding process may include a method of electrically connecting a bonding metal formed on an uppermost metal layer of the upper chip and a bonding metal formed on an uppermost metal layer of the lower chip. For example, the bonding metals may include copper (Cu) using a Cu-to-Cu bonding. However, embodiments of the inventive concept are not limited thereto. For example, the bonding metals may also be formed of aluminum (Al) or tungsten (W).

Each of the peripheral circuit region PERI and the cell region CELL of the memory device 141 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high electrical resistivity, and the second metal layers 240a, 240b, and 240c may be formed of copper having relatively low electrical resistivity.

In the example embodiment illustrated in FIG. 3, although only the first metal layers 230a, 230b, and 230c and the second metal layers 240a, 240b, and 240c are shown and described, embodiments of the inventive concept are not limited thereto. For example, one or more additional metal layers may be further formed on the second metal layers 240a, 240b, and 240c. At least a portion of the one or more additional metal layers formed on the second metal layers 240a, 240b, and 240c may be formed of aluminum or another metal having a lower electrical resistivity than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide or silicon nitride.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically bonded to upper bonding metals 371b and 372b of the cell region CELL. The lower bonding metals 271b and 272b and the upper bonding metals 371b and 372b may be formed of aluminum, copper, or tungsten. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction (a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction (a Z-axis direction), perpendicular to the upper surface of the second substrate 310, and pass through the plurality of word lines 330, the at least one string select line, and the at least one ground select line. The channel structure CH may include a data storage layer, a channel layer, and a buried insulating layer, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In the example embodiment illustrated in FIG. 3, an area in which the channel structure CH, and the bit line 360c are disposed may be defined as the bit line bonding area BLBA. In the bit line bonding area BLBA, the bit line 360c may be electrically connected to the circuit elements 220c including a page buffer 393 in the peripheral circuit region PERI. The bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310 and perpendicular to the first direction, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending at different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the peripheral circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b forming a row decoder 394 in the peripheral circuit region PERI. In an example embodiment, operating voltages of the circuit elements 220b of the row decoder 394 are different than operating voltages of the circuit elements 220c forming the page buffer 393. For example, operating voltages of the circuit elements 220c forming the page buffer 393 may be greater than operating voltages of the circuit elements 220b forming the row decoder 394.

A common source line contact plug 380 may be disposed in the external pad bonding area PA. The common source line contact plug 380 may be formed of a conductive material such as a metal, a metal compound, or polysilicon, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 3, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 3, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303. In an example embodiment, the second input-output pad 305 is electrically connected to a circuit element 220a.

According to an example embodiment, the second substrate 310 and the common source line 320 are not disposed in an area in which the second input-output contact plug 303 is disposed. Also, the second input-output pad 305 does not overlap the word lines 330 in the third direction (the Z-axis direction). Referring to FIG. 3, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

According to an example embodiment, the first input-output pad 205 and the second input-output pad 305 are selectively formed. For example, the memory device 141 may include only the first input-output pad 205 disposed on the first substrate 210 or the second input-output pad 305 disposed on the second substrate 310. Alternatively, the memory device 141 may include both the first input-output pad 205 and the second input-output pad 305.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 141 may include a lower metal pattern 273a corresponding to an upper metal pattern 372a formed in an uppermost metal layer of the cell region CELL, and having the same cross-sectional shape as the upper metal pattern 372a of the cell region CELL so as to be connected to each other, in an uppermost metal layer of the peripheral circuit region PERI. In the peripheral circuit region PERI, in an embodiment, the lower metal pattern 273a formed in the uppermost metal layer of the peripheral circuit region PERI is not connected to a contact. Similarly, in the external pad bonding area PA, an upper metal pattern 372a, corresponding to the lower metal pattern 273a formed in an uppermost metal layer of the peripheral circuit region PERI, and having the same shape as a lower metal pattern 273a of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu-to-Cu bonding.

Further, in the bit line bonding area BLBA, an upper metal pattern 392, corresponding to a lower metal pattern 252 formed in the uppermost metal layer of the peripheral circuit region PERI, and having the same cross-sectional shape as the lower metal pattern 252 of the peripheral circuit region PERI, may be formed in an uppermost metal layer of the cell region CELL. In an embodiment, a contact is not formed on the upper metal pattern 392 formed in the uppermost metal layer of the cell region CELL.

In an example embodiment, corresponding to a metal pattern formed in an uppermost metal layer in one of the cell region CELL and the peripheral circuit region PERI, a reinforcement metal pattern having the same cross-sectional shape as the metal pattern may be formed in an uppermost metal layer in the other one of the cell region CELL and the peripheral circuit region PERI. In an embodiment, a contact is not formed on the reinforcement metal pattern.

Figure 4:
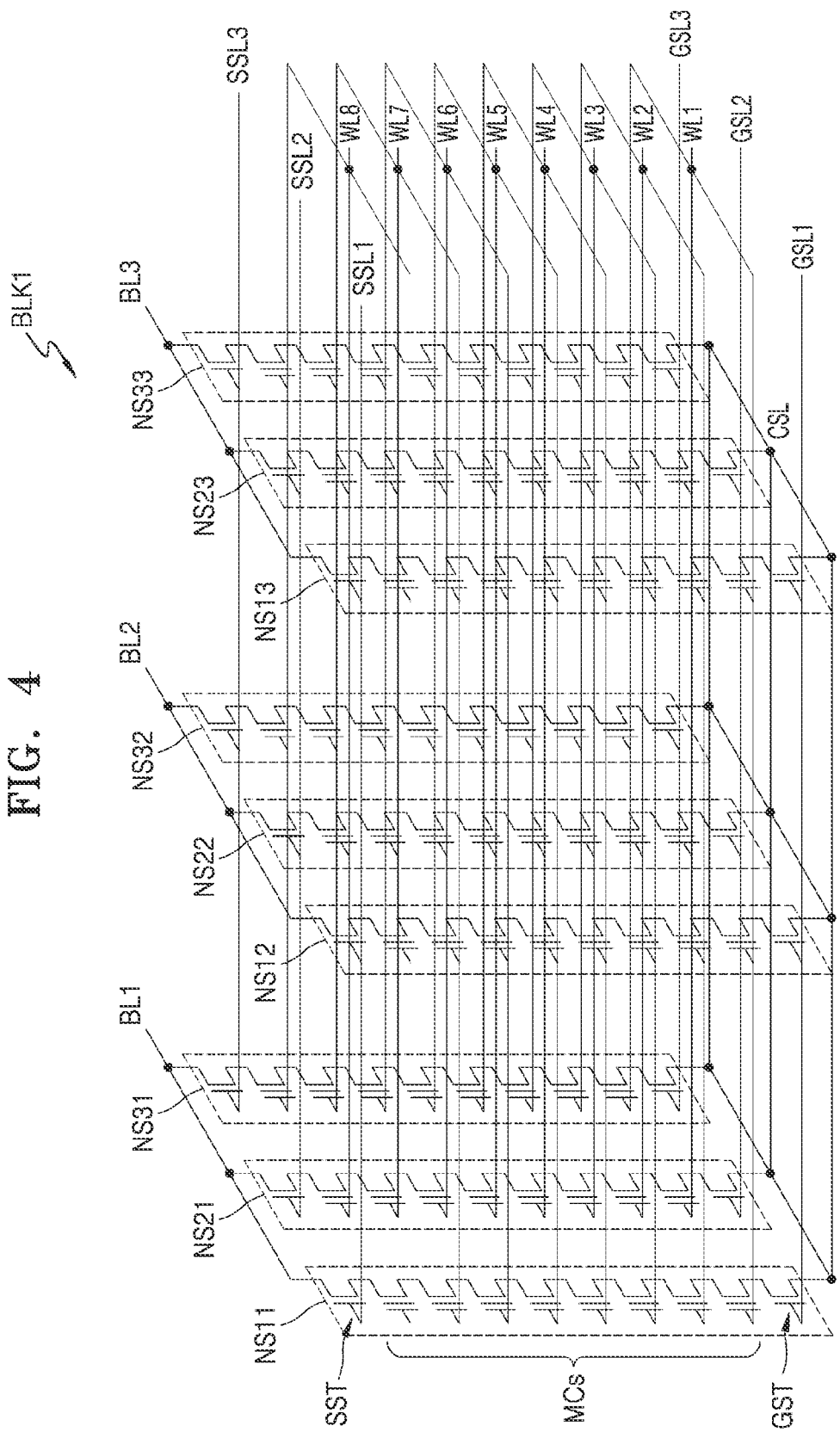
FIG. 4 is an equivalent circuit diagram of a memory block of FIG. 2.

FIG. 4 is an equivalent circuit diagram of the memory block of FIG. 2. The memory block of FIG. 4 is an example of one of the memory blocks BLK1 to BLKn described with reference to FIG. 2 and indicates the first memory block BLK1. Hereinafter, one or more embodiments of the inventive concept will be described by taking the first memory block BLK1 as an example. The first memory block BLK1 is a three-dimensional memory block having a three-dimensional structure on a substrate. Memory cell strings included in the first memory block BLK1 may be formed in a direction perpendicular to the substrate.

Referring to FIG. 4, the first memory block BLK1 may include NAND strings NS11 to NS33, word lines WL1 to WL8, bit lines BL1 to BL3, ground selection lines GSL1 to GSL3, string selection lines SSL1 to SSL3, and a common source line CSL. FIG. 4 illustrates that each of the NAND strings NS11 to NS33 include eight memory cells MCs connected to eight word lines WL1 to WL8, but one or more embodiments of the inventive concept are not limited thereto.

Each NAND string (e.g., NS11) may include a string selection transistor SST, memory cells MC, and a ground selection transistor GST, which are connected in series. The string selection transistor SST is connected to a corresponding string selection line SSL1. The memory cells MC are connected to corresponding word lines WL1 to WL8, respectively. The ground selection transistor GST is connected to a corresponding ground selection line GSL1. The string selection transistor SST is connected to corresponding bit lines BL1 to BL3, and the ground selection transistor GST is connected to the common source line CSL.

According to an embodiment, in each cell string, one or more dummy memory cells may be provided between the string selection transistor SST and the memory cells MC. In each cell string, one or more dummy memory cells may be provided between the ground selection transistor GST and the memory cells MC. In each cell string, one or more dummy memory cells may be provided between the memory cells MC. The dummy memory cells may have the same structure as the memory cells MC and are not programmed (e.g., programming is prevented) or may be programmed differently from the memory cells MC. For example, when the memory cells MC are programmed to have two or more threshold voltage distributions, the dummy memory cells may be programmed to have a threshold voltage distribution range or threshold voltage distributions of which the number is less than the number of threshold voltage distributions of the memory cells MC.

Figure 5:
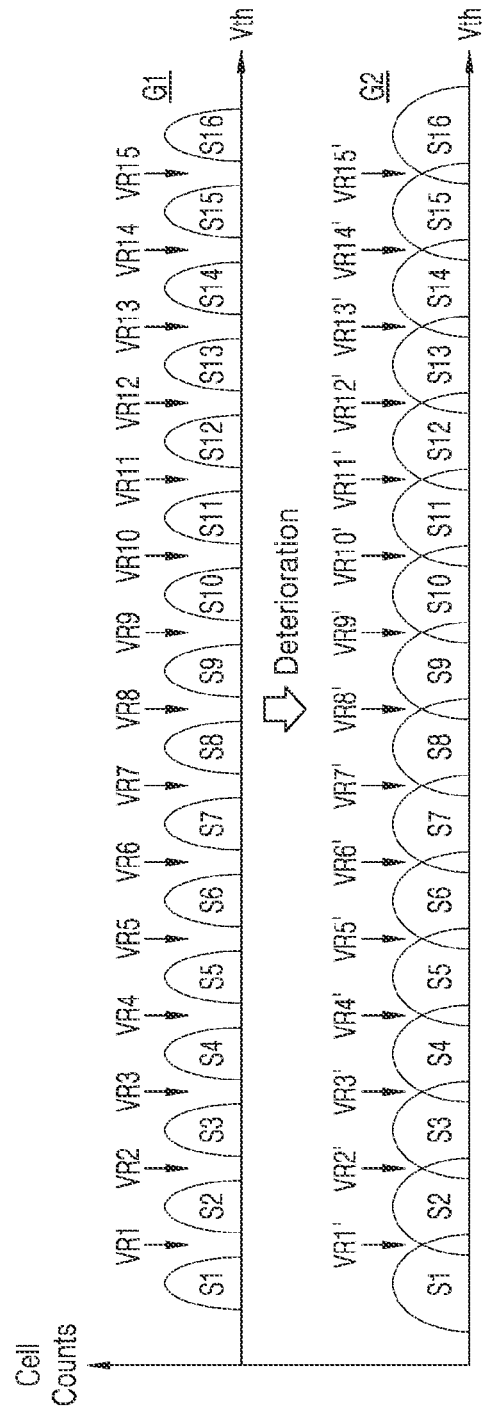
FIG. 5 includes graphs illustrating shifts in a threshold voltage distribution of memory cells of FIG. 4.

FIG. 5 includes graphs illustrating shifts of a threshold voltage distribution of the memory cells of FIG. 4. Graphs G1 and G2 of FIG. 5 respectively indicate distributions of threshold voltages of memory cells connected to a certain word line. For example, the certain word line could be a first word line in the first memory block BLK1. The horizontal axis indicates the threshold voltages of the memory cells, and the vertical axis indicates cell counts, that is, the number of memory cells.

Referring to FIG. 5, one or more bits may be programmed in the memory cell connected to the first word line. According to the number of bits stored in the memory cell, the memory cell may be classified as SLC, MLC, TLC, or QLC. According to the number of bits stored in the memory cell, the memory cell may have one of various states. The states may be defined as a range of the threshold voltages. Referring to FIG. 5, the memory cell may be the QLC, and a threshold voltage of the memory cell may be programmed in one of 16 states S1 to S16.

After data is programmed into the memory cell, disturbance deterioration or retention deterioration may occur in the memory cell. The disturbance deterioration indicates that threshold voltages of memory cells change because of programming, reading, erasing, or coupling occurring around the memory cells. The retention deterioration indicates that, after charges are trapped in a charge trap layer of a memory cell and the memory cell is programmed, threshold voltages of memory cells change because the trapped charges leak as time passes. Because the threshold voltage of the memory cell changes when the deterioration occurs in the memory cell, data in the memory cell may not be read (that is, the data is damaged) when using read levels that are initially set.

In FIG. 5, when the memory cells indicate a distribution of the threshold voltages as in Graph G1, optimum read levels for reading the data stored in the memory cells may be VR1 to VR15. Because of the deterioration, Graph G1 may be changed to Graph G2 or shifted. When the memory cells indicate a distribution of the threshold voltages as in Graph G2, optimum read levels for reading the data stored in the memory cells may be changed to VR1' to VR15' instead of VR1 to VR15.

During the read operation, the control circuit 124 may perform a two-step EOS operation, obtain a target read level and a target develop point in time as a result of the two-step EOS operation, and perform a main read operation on the selected memory cell by using the target read level and the target develop point in time so as to perform a read operation on the selected memory cell connected to the first word line at the changed read levels VR1' to VR15'.

Figure 6:
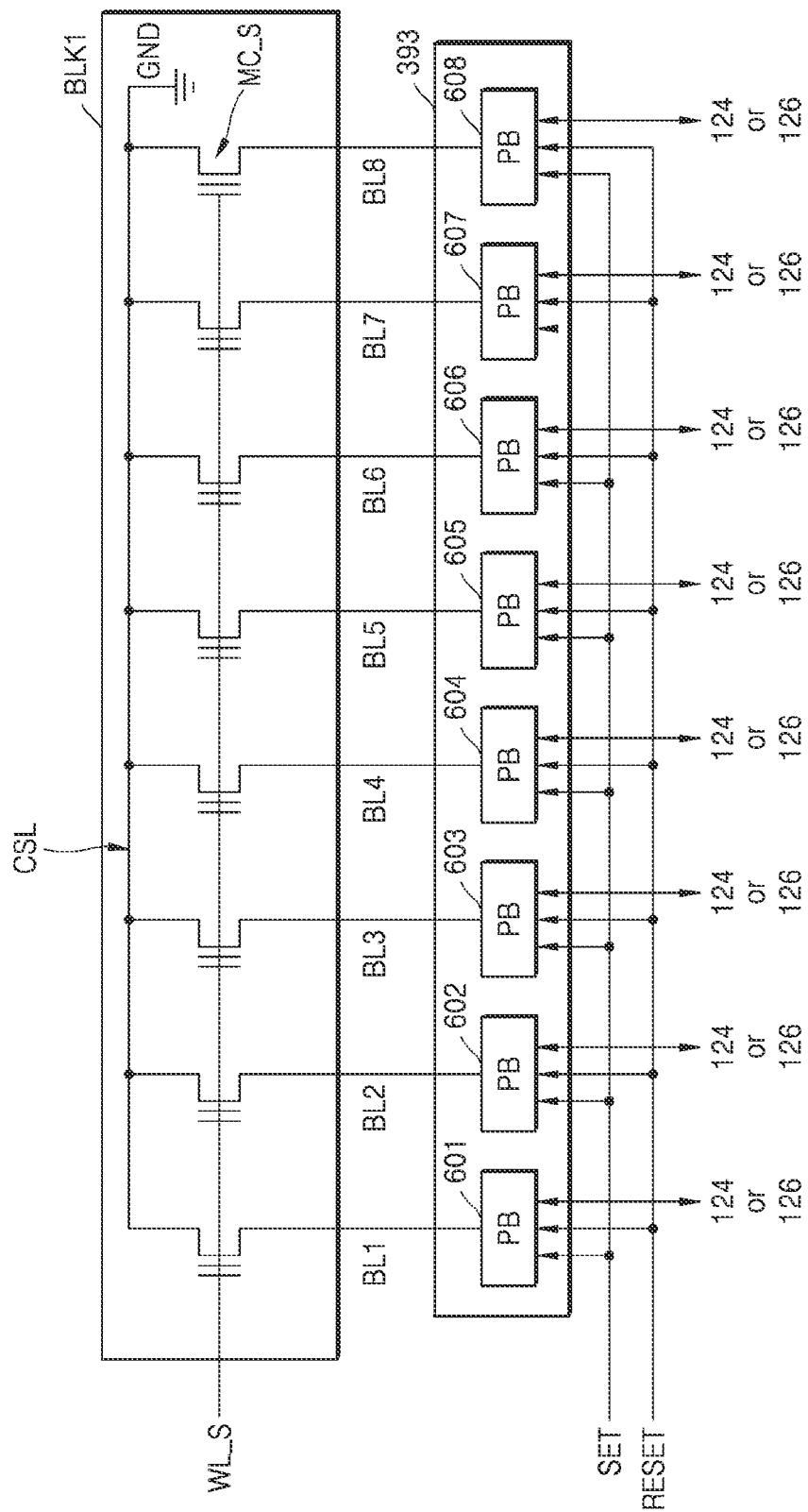
FIG. 6 illustrates an example of a page buffer of FIG. 2.

FIG. 6 illustrates an example of the page buffer of FIG. 2. FIG. 6 conceptually illustrates a selected memory cell MC_S of the first memory block BLK1. FIG. 6 illustrates page buffer circuits 601 to 608 connected to some memory cells connected to a selected word line WL_S from among the cell strings described with reference to FIG. 4. For clarity of the drawing, the memory cells connected to the selected word line WL_S are respectively connected between the bit lines BL1 to BL8 and the common source line CSL, and the transistors and memory cells connected to the string selection line, the ground selection line, and non-selection word lines are not illustrated.

Referring to FIG. 6, the bit lines BL1 to BL8 of the memory cells connected to the selected word line WL_S are connected to the page buffer circuits 601 to 608, respectively. During the read operation, the page buffer circuits 601 to 608 may respectively sense voltage levels of the bit lines BL1 to BL8 and may obtain (or latch) the voltage levels. The page buffer circuits 601 to 608 may transmit the sensed and latched data to the control circuit 124 or the input/output circuit 126.

When the page buffer circuits 601 to 608 sense the voltage levels of the bit lines BL1 to BL8, the page buffer circuits 601 to 608 may be separated into odd page buffer circuits 601, 603, 605, and 607 and even page buffer circuits 602, 604, 606, and 608 to operate. The odd page buffer circuits 601, 603, 605, and 607 may be connected to odd bit lines BL1, BL3, BL5, and BL7, and the even page buffer circuits 602, 604, 606, and 608 may be connected to even bit lines BL2, BL4, BL6, and BL8.

For example, the even page buffer circuits 602, 604, 606, and 608 may sense and latch voltage levels of the even bit lines BL2, BL4, BL6, and BL8 in response to a first control signal SET and a second control signal RESET that are sequentially applied. The odd page buffer circuits 601, 603, 605, and 607 may sense and latch voltage levels of the odd bit lines BL1, BL3, BL5, and BL7 in response to the first control signal SET and the second control signal RESET that are sequentially applied. In this case, a point in time when the first control signal SET is applied to the odd page buffer circuits 601, 603, 605, and 607 may be different from a point in time when the first control signal SET is applied to the even page buffer circuits 602, 604, 606, and 608. That is, with a certain time difference, the first control signal SET may be applied to the odd page buffer circuits 601, 603, 605, and 607 and the even page buffer circuits 602, 604, 606, and 608. In an exemplary embodiment, a multiplexer is used to apply the first control signal SET to the odd page buffer circuits 601, 603, 605, and 607 at a first time and then to apply the first control signal SET to the even page buffer circuits 602, 604, 606, and 608 at a second time different from the first time. For example, a control signal at a first level may be applied to the multiplexer at the first time to cause the multiplexer to output the first control signal SET to the odd page buffer circuits 601, 603, 605, and 607, and the control signal a second other level may be output to the multiplexer at the second time to cause the multiplexer to output the first control signal SET to the even page buffer circuits 602, 604, 606, and 608.

Here, the transmission of the first control signal SET to the odd page buffer circuits 601, 603, 605, and 607 and the even page buffer circuits 602, 604, 606, and 608 with a time difference may indicate that when the page buffer circuits 601 to 608 sense whether the memory cells are on or off, the memory cells are sensed at different points in time. A sensing operation of the even page buffer circuits 602, 604, 606, and 608 may be referred to as even sensing E_Sensing, and a sensing operation of the odd page buffer circuits 601, 603, 605, and 607 may be referred to as odd sensing O_Sensing. Accordingly, the page buffer 393 may perform an EOS operation in a stated order of even sensing and odd sensing. According to an embodiment, the EOS operation may be performed in an order of odd sensing and then even sensing. The sensing operation on the even page buffer circuits 602, 604, 606, and 608 during a first time period and the sensing operation on the odd page buffer circuits 601, 603, 605, and 607 during a second other time period during processing of a read operation may be referred to as performing a time interleaved sensing or sampling.

Figure 7:
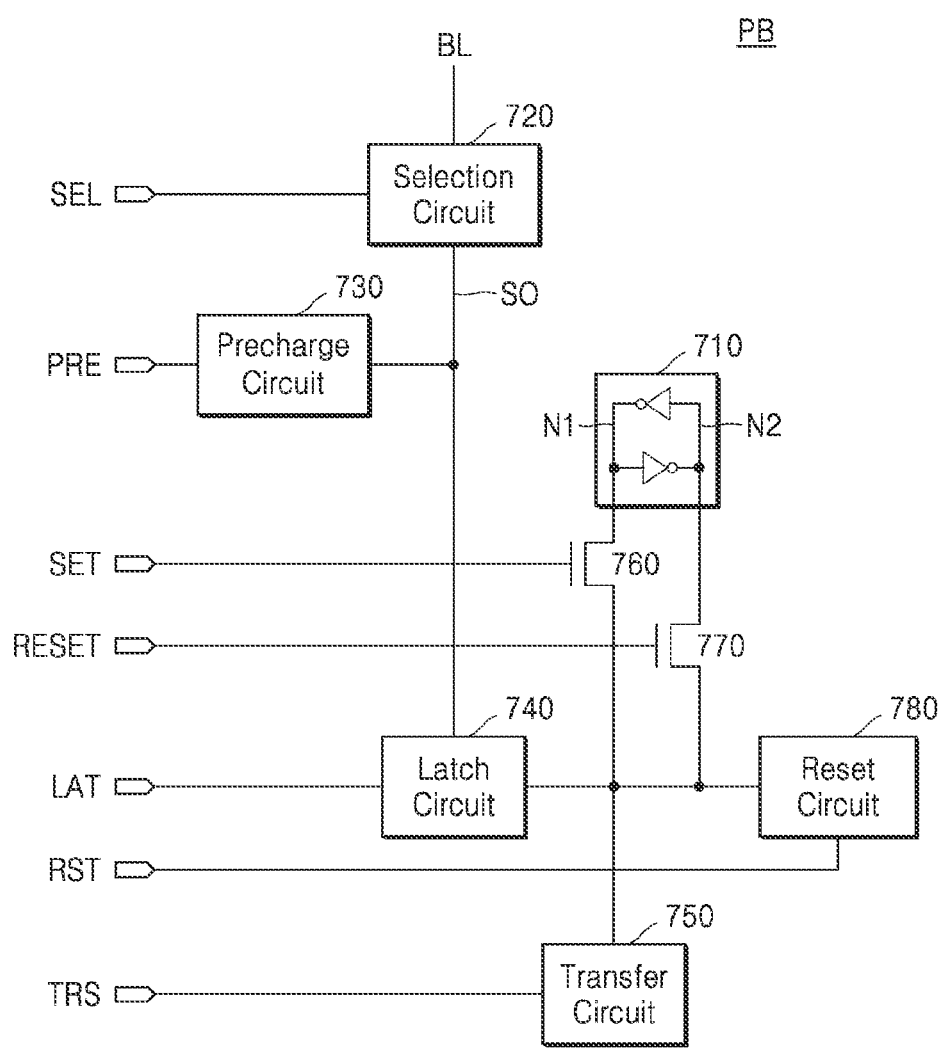
FIGS. 7 and 8 are diagrams of a page buffer circuit of FIG. 6.
Figure 8:
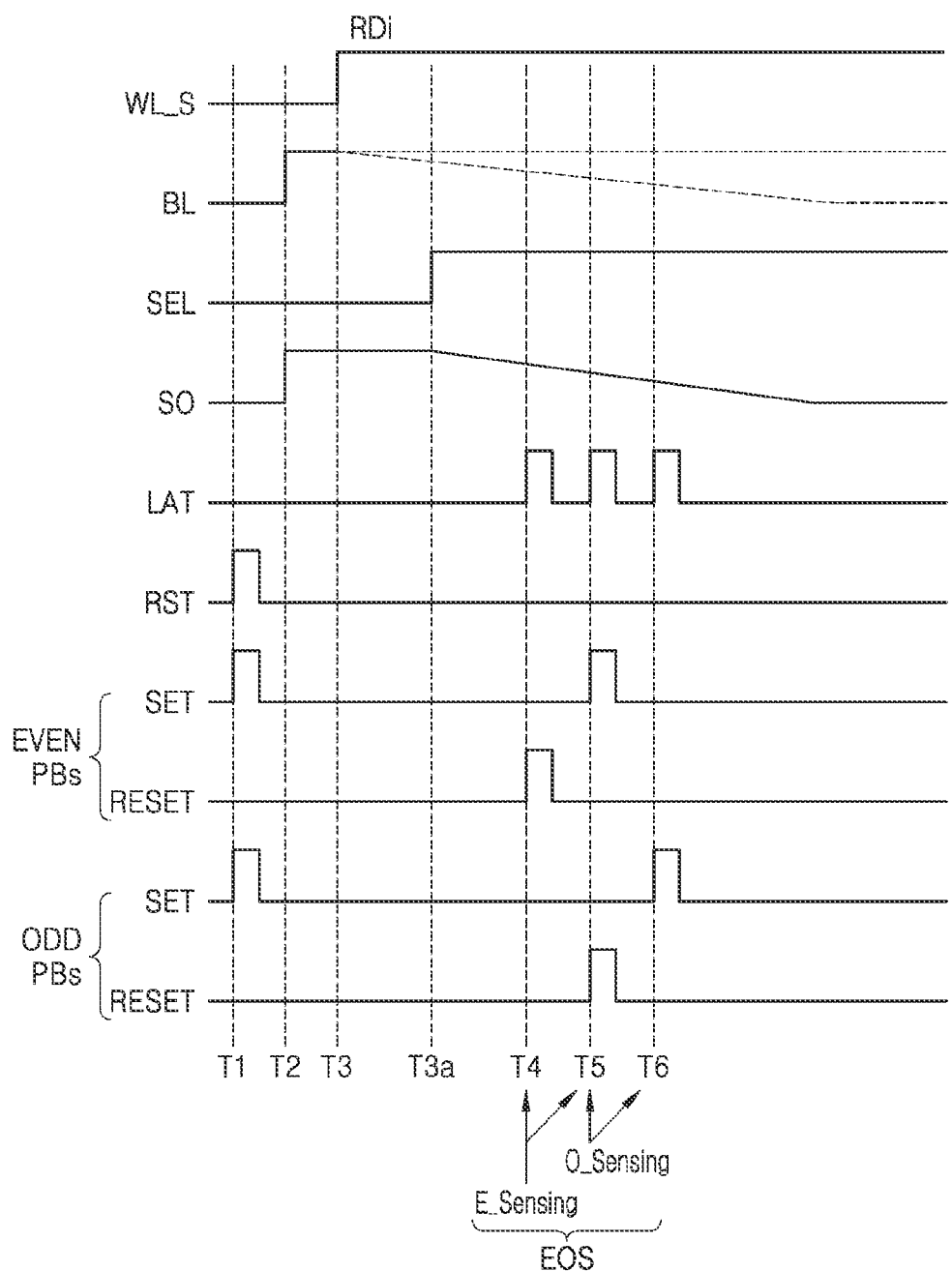

FIGS. 7 and 8 are diagrams for explaining the page buffer circuit of FIG. 6. FIG. 7 is a circuit diagram of a page buffer circuit PB, and FIG. 8 is a timing diagram for explaining the operation of the page buffer circuit PB. It is noted that the timing diagrams of the inventive concept are not necessarily in a uniform ratio.

Referring to FIG. 7, the page buffer circuit PB includes a sensing latch 710, a selection circuit 720, a precharge circuit 730, a latch circuit 740, a transfer circuit 750, a first transistor 760, a second transistor 770, and a reset circuit 780.

The sensing latch 710 may include cross-coupled inverters between a first node N1 and a second node N2. The sensing latch 710 may store a detection result of a voltage level of a bit line BL. The selection circuit 720 may electrically connect a sensing node SO to the bit line BL or separate the sensing node SO from the bit line BL, in response to a selection signal SEL. The precharge circuit 730 may apply a precharge voltage to the sensing node SO in response to a precharge signal PRE. The latch circuit 740 may be connected to the sensing node SO and transmit a voltage level of the sensing node SO to the first transistor 760 and the second transistor 770 in response to a latch signal LAT. The transfer circuit 750 may be connected to the first transistor 760 and the second transistor 770 and transmit a detection result stored in the sensing latch 710 to the control circuit 124 or the input/output circuit 126 in response to a transmission signal TRS. The first transistor 760 may be controlled by the first control signal SET, and the second transistor 770 may be controlled by the second control signal RESET.

Referring to FIG. 8, at a point in time T1, the reset signal RST and the first control signal SET are transmitted in a logic high pulse. For example, the reset signal RST and the first control signal SET may transition to a logic high state at time T1. In this case, the first node N1 of the sensing latch 710 may be initialized to, for example, a ground voltage level, and the second node N2 of the sensing latch 710 may be initialized to a power voltage level.

At a point in time T2, the bit line BL and the sensing node SO is precharged to a precharge voltage (e.g., a power voltage).

At a point in time T3, a read voltage RDi is applied to the selected word line WL_S. The read voltage RDi may have one of levels VRD1 to VRD15 as in FIG. 12, according to levels to be compared with the threshold voltages of the selected memory cell MC_S. When the threshold voltage of the selected memory cell MC_S is higher than the read voltage RDi, the selected memory cell MC_S is turned off. Accordingly, a voltage level of the bit line BL may remain at the precharge level. On the contrary, when the threshold voltage of the selected memory cell MC_S is less than or equal to the read voltage RDi, the selected memory cell is turned on. Accordingly, the voltage level of the bit line BL may be discharged to a ground level.

At a point in time T3a, the selection signal SEL is applied at a logic high level, and the bit line BL and the sensing node SO are electrically connected to each other. Accordingly, a voltage level of the sensing node SO may be developed or set according to the voltage level of the bit line BL.

At a point in time T4, after the latch signal LAT and the second control signal RESET are applied to the even page buffer circuits 602, 604, 606, and 608 in a logic high pulse, the latch signal LAT and the first control signal SET are applied to the even page buffer circuits 602, 604, 606, and 608 in a logic high pulse at a point in time T5. In the points in time T4 and T5, the even sensing E_Sensing of the even page buffer circuits 602, 604, 606, and 608 is performed, and the points in time T4 and T5 may be considered as points in time when the sensing nodes SO of the even page buffer circuits 602, 604, 606, and 608 are developed.

At the point in time T5, after the latch signal LAT and the second control signal RESET are applied in the logic high pulse to the odd page buffer circuits 601, 603, 605, and 607, the latch signal LAT and the first control signal SET are applied in the logic high pulse to the odd page buffer circuits 601, 603, 605, and 607 at a point in time T6. At the points in time T5 and T6, the odd sensing O_Sensing of the odd page buffer circuits 601, 603, 605, and 607 is performed, and the points in time T5 and T6 may be considered as points in time when the sensing nodes SO of the odd page buffer circuits 601, 603, 605, and 607 are developed.

Figure 9:
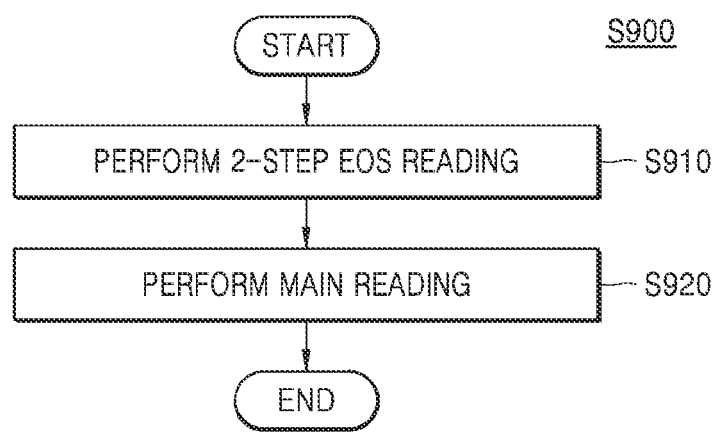
FIGS. 9 and 10 are flowcharts of a method for reading a non-volatile memory, according to an exemplary embodiment of the inventive concept.
Figure 10:
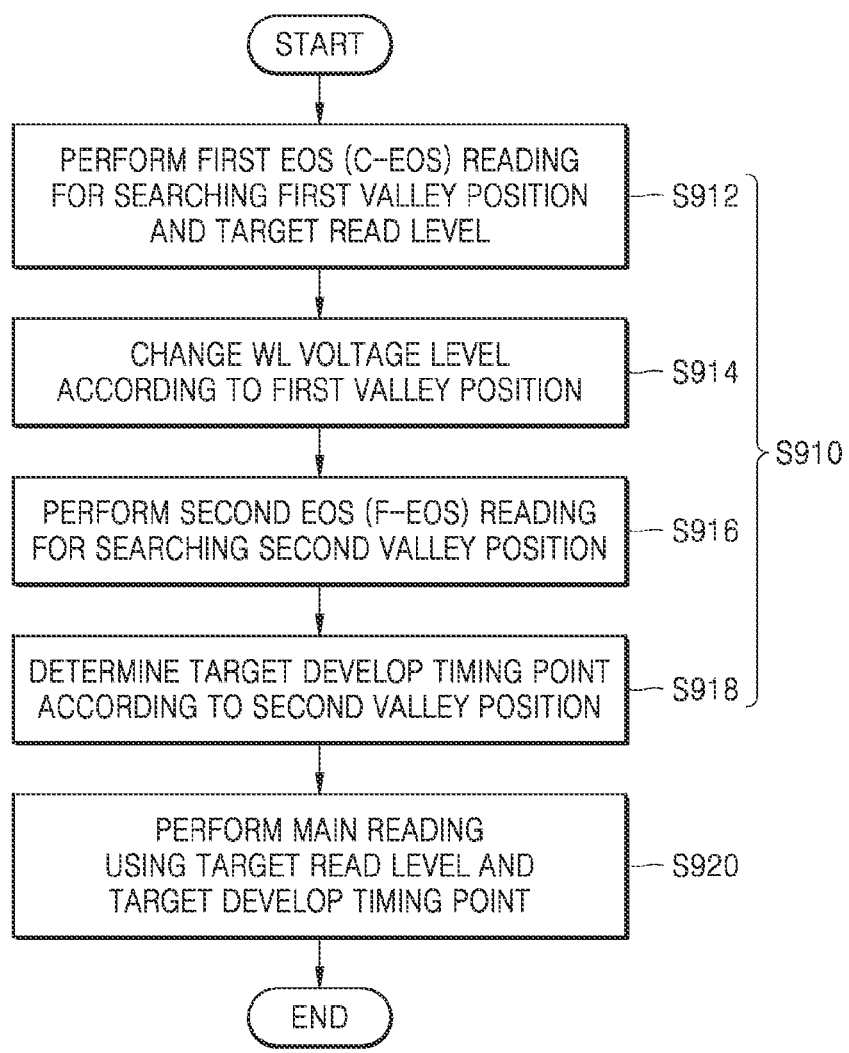

FIGS. 9 and 10 are flowcharts of a method of reading a non-volatile memory, according to an exemplary embodiment of the inventive concept.

Referring to FIGS. 2 and 6 to 9, a method of reading S900 of the non-volatile memory NVM includes performing a two-step EOS reading in operation S910 and then performing a main read operation in operation S920.

In operation S910, EOS reading of the page buffer 393 is performed twice.

In operation S920, main reading is performed once on the selected memory cell.

Referring to FIG. 10, during the two-step EOS reading in operation S910, an operation of performing a first EOS reading to find a first valley location (S912) is performed, and the target read level of the read voltage RDi may be found by using the first valley location found during the first EOS reading. Then, an operation of changing the target voltage level of the read voltage RDi (S914) is performed to find the target develop point in time of the sensing node SO.

The first EOS reading in operation S912 is an operation of approximately (or roughly) searching for the first valley location and may be referred to as C-EOS reading. In embodiments below, the terms "first EOS operation," "first EOS reading," and "C-EOS operation" may be interchangeably used.

In operation S914, the target read level of the read voltage RDi obtained as a result of the first EOS reading may slightly increase or decrease. According to an embodiment, the target read level of the read voltage RDi of the selected word line WL_S is changed n times. For example, when n is 3, such changes are made approximately three times.

The two-step EOS reading in operation S910 includes an operation of performing a second EOS reading to search for a second valley location (S916) and an operation of determining a point in time, that is, the target develop point in time, when the first control signal SET and the second control signal RESET are transmitted according to the second valley location (S918).

The second EOS reading in operation S916 is an operation performed according to target read levels RDi of three modified selected word lines WL_S to accurately (or finely) search for a second valley location compared to the first valley location and may be referred to as F_EOS reading. In embodiments below, the terms "the second EOS operation," "the second EOS reading," and "the F-EOS operation" may be interchangeably used.

In operation S920, main reading on the selected memory cell is performed once by using the target read level and the target develop point in time. In embodiments below, the terms "a main read operation" and "a main reading" may be interchangeably used.

Figure 11A:
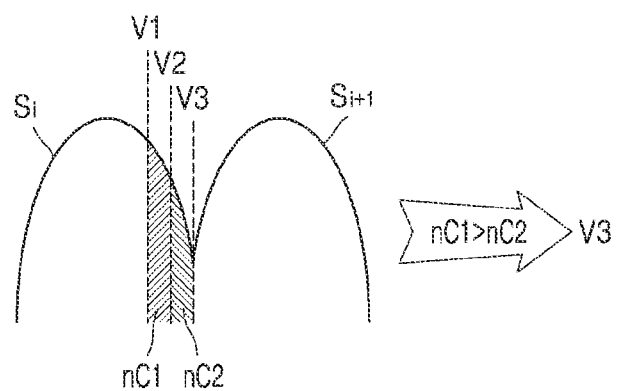
FIGS. 11A to 11C are diagrams for explaining a valley search operation according to a two-step Even Odd Sensing (EOS) reading of FIG. 10.
Figure 11B:
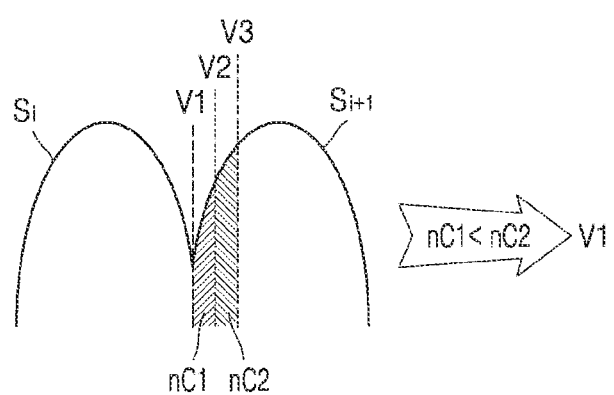
Figure 11C:
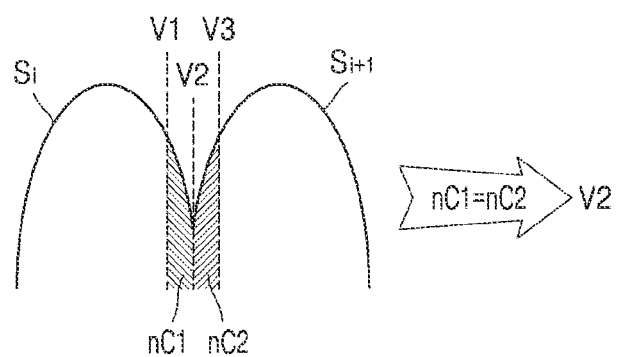

FIGS. 11A to 11C are diagrams of a valley search operation according to the two-step EOS reading of FIG. 10. Referring to FIGS. 11A to 11C, levels of threshold voltages for identifying two states Si and Si+1 (e.g., programming states) of the memory cell may be modeled. In FIGS. 11A to 11C, the horizontal axis indicates a threshold voltage VTH of memory cells, and the vertical axis indicates the number of memory cells.

The valley search may be performed by performing detections by using levels around a level predicted as a valley and counting the number of memory cells according to results of the detections. For example, the non-volatile memory NVM may perform the two-step EOS reading by using a first voltage V1 and a second voltage V2 and may count the number nC1 of memory cells having threshold voltages between the first voltage V1 and the second voltage V2, by using the MBC 125 of the control circuit 124. The non-volatile memory NVM may perform the two-step EOS reading by using the second voltage V2 and a third voltage V3 and may count, using the MBC 125 of the control circuit 124, the number nC2 of memory cells having threshold voltages between the second voltage V2 and the third voltage V3. The non-volatile memory NVM may identify a valley V according to a counting result. For example, the valley may be identified from the counting results of nC1 and nC2.

Referring to FIG. 11A, when it is determined that the number nC1 of memory cells obtained through the two-step EOS reading is greater than the number nC2 of memory cells, and when a differential value |nC1-nC2| is equal to or greater than a reference value, the control circuit 124 may determine that the third voltage V3 is an optimum read level of the valley.

Referring to FIG. 11B, when it is determined that the number nC2 of memory cells obtained through the two-step EOS reading is greater than the number nC1, and when the differential value |nC1-nC2| is equal to or greater than the reference value, the control circuit 124 may determine that the first voltage V1 is an optimum read level of the valley.

In FIG. 11C, when it is determined that the number nC1 of memory cells obtained through the two-step EOS reading is equal to the number nC2, or when the differential value |nC1-nC2| is less than the reference value, the control circuit 124 may determine that the second voltage V2 is the optimum read level of the valley.

Figure 12:
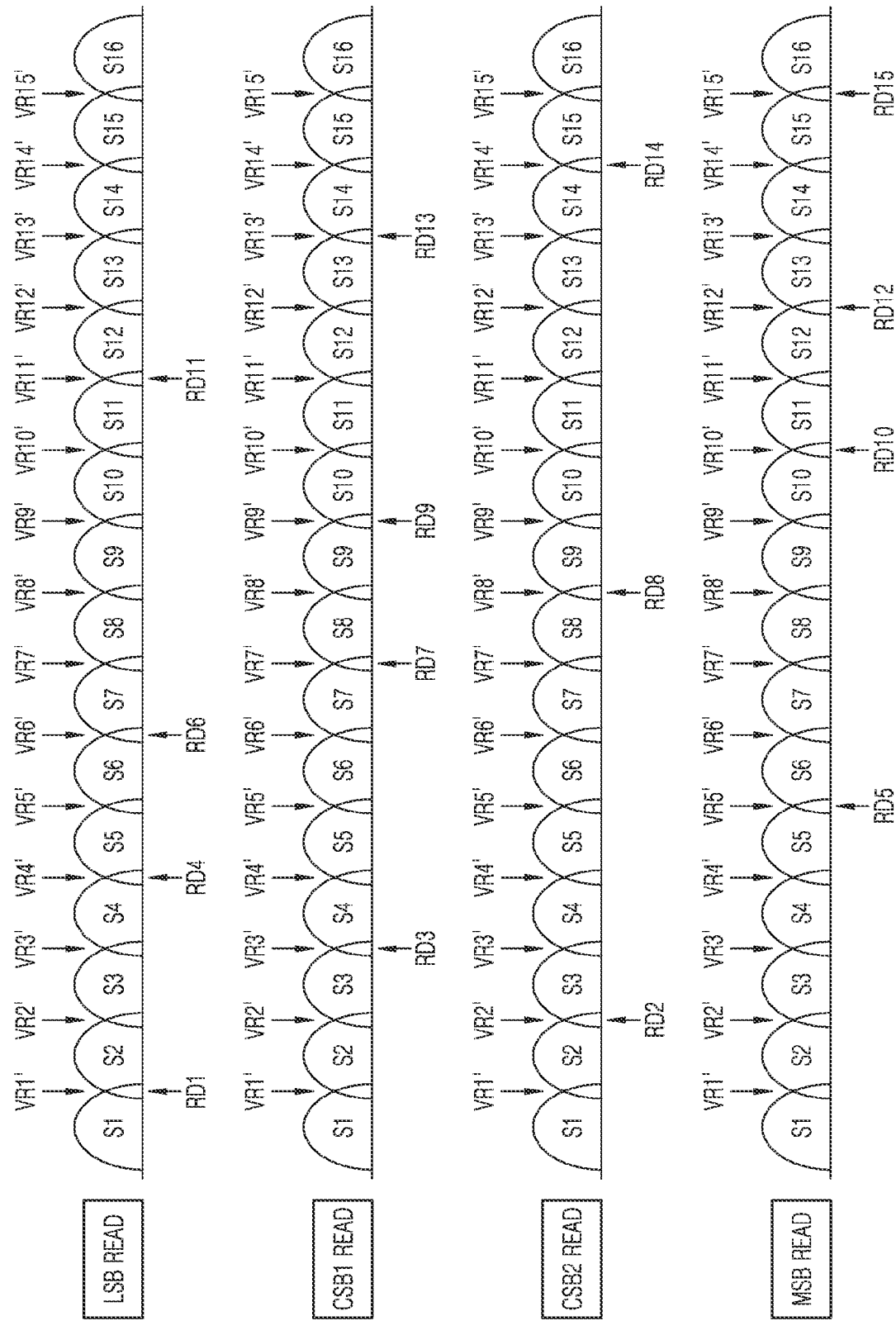
FIGS. 12 and 13 are diagrams for explaining a method of reading a non-volatile memory, according to an exemplary embodiment of the inventive concept.
Figure 13:
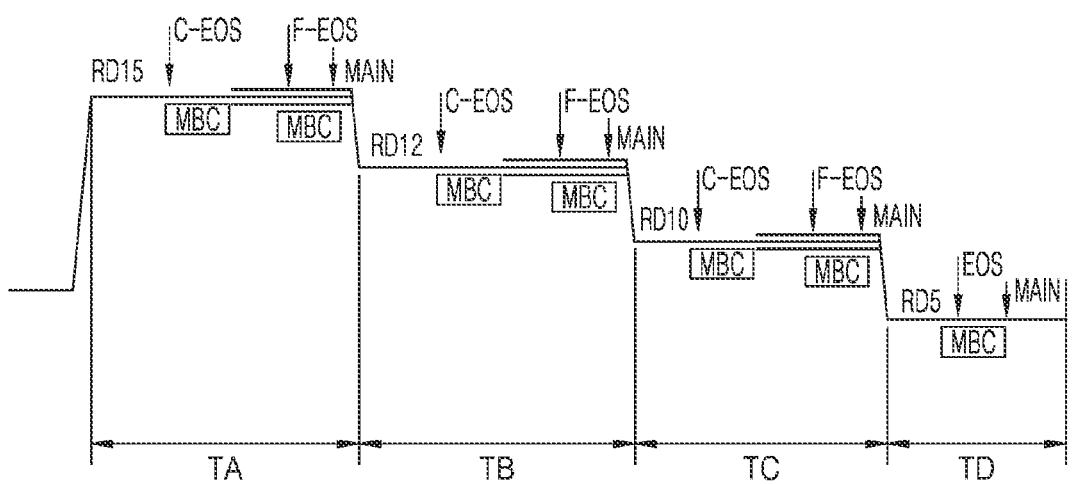

FIGS. 12 and 13 are diagrams for explaining a method of reading of a non-volatile memory, according to an exemplary embodiment of the inventive concept. FIG. 12 is a graph showing a threshold voltage distribution of memory cells. Although FIG. 12 is a graph showing a threshold voltage distribution when the memory cells are QLCs, the descriptions of FIG. 12 may be similarly applied to memory cells storing therein a different number of bits. FIG. 13 illustrates a method of reading a most significant bit (MSB) page. The method of reading the MSB page may be identically applied to methods of reading a least significant bit (LSB) page, a first central significant bit (CSB1), and a second central significant bit (CSB2).

When each memory cell is a QLC, a state of each memory cell may correspond to one of 16 states S1 to S16. The memory cells connected to one word line may include an LSB page, a CSB1 page, a CSB2 page, and an MSB page. A state determined in an operation of reading each page may differ.

For example, in an operation of reading the LSB page, the non-volatile memory NVM may determine $11^{th}$ and $12^{th}$ states S11 and S12 by applying an $11^{th}$ read voltage RD11 to the selected word line WL_S and may determine $6^{th}$ and $7^{th}$ states S6 and S7, $4^{th}$ and $5^{th}$ states S4 and S5, and $1^{st}$ and $2^{nd}$ states S1 and S2 by sequentially applying a $6^{th}$ read voltage RD6, a $4^{th}$ read voltage RD4, and a $1^{st}$ read voltage RD1 to the selected word line WL_S. The $11^{th}$ read voltage RD11 may be referred to as the highest read voltage of the LSB page.

In an operation of reading the CSB1 page, the non-volatile memory NVM may determine $13^{th}$ and $14^{th}$ states S13 and S14, $9^{th}$ and $10^{th}$ states S9 and S10, $7^{th}$ and $8^{th}$ states S7 and S8, and $3^{rd}$ and $4^{th}$ states S3 and S4 by sequentially applying, to the selected word line WL_S, a $13^{th}$ read voltage RD13, a $9^{th}$ read voltage RD9, a $7^{th}$ read voltage RD7, and a $3^{rd}$ read voltage RD3. The $13^{th}$ read voltage RD13 may be referred to as the highest read voltage of the CSB1 page.

In an operation of reading the CSB2 page, the non-volatile memory NVM may determine $14^{th}$ and $15^{th}$ states S14 and S15, $8^{th}$ and $9^{th}$ states S8 and S9, and the $2^{nd}$ and $3^{rd}$ states S2 and S3 by sequentially applying, to the selected word line WL_S, a $14^{th}$ read voltage RD14, an $8^{th}$ read voltage RD8, and the $2^{nd}$ read voltage RD2. The $14^{th}$ read voltage RD14 may be referred to as the highest read voltage of the CSB2 page.

In an operation of reading the MSB page, the non-volatile memory NVM may determine $15^{th}$ and $16^{th}$ states S15 and S16, $12^{th}$ and $13^{th}$ states S12 and S13, $10^{th}$ and $11^{th}$ states S10 and S11, $5^{th}$ and $6^{th}$ states S5 and S6 by applying, to the selected word line WL_S, a $15^{th}$ read voltage RD15, a $12^{th}$ read voltage RD12, a $10^{th}$ read voltage RD10, and a $5^{th}$ read voltage RD5. The $15^{th}$ read voltage RD15 may be referred to as the highest read voltage of the MSB page.

Referring to FIGS. 10, 12 and 13, a method of reading the MSB page may include: a first read operation based on the $15^{th}$ read voltage RD15 that is the highest read voltage in a section TA (or a first period); a second read operation based on the $12^{th}$ read voltage RD12 that is the second highest read voltage in a section TB (or a second period); a third read operation based on the $10^{th}$ read voltage RD10 that is the second lowest read voltage in a section TC (or a third period); and a fourth read operation based on the $5^{th}$ read voltage RD5 that is the lowest read voltage in a section TD (or a fourth period).

In the first read operation in the section TA, C-EOS reading may be performed by applying the $15^{th}$ read voltage RD15 to the selected word line WL_S, the number of memory cells obtained through a result of the C-EOS reading may be stored in the MBC 125 of the control circuit 124, and thus, a $15^{th}$ valley location may be roughly searched for. F-EOS reading may be performed by changing a level of the $15^{th}$ read voltage RD15 according to an approximate $15^{th}$ valley location, a target read level of the $15^{th}$ read voltage RD15 may be determined according to an accurate $15^{th}$ valley location that is searched for as a result of the E_EOS reading, and a target develop point in time when the first control signal SET is provided may be determined. Then, a main reading operation performed on the selected memory cell may be performed using the target read level of the $15^{th}$ read voltage RD15 and the target develop point in time.

In the second read operation in the section TB, C-EOS reading may be performed by applying the $12^{th}$ read voltage RD12 to the selected word line WL_S, and the number of memory cells obtained through a result of the C-EOS reading is stored in the MBC 125 of the control circuit 124, thereby approximately searching for the $12^{th}$ valley location. F-EOS reading may be performed by changing a level of the $12^{th}$ read voltage RD12 according to an approximate $12^{th}$ valley location, a target read level of the $12^{th}$ read voltage RD12 may be determined according to an accurate $12^{th}$ valley location that is found as a result of the E-EOS reading, and a target develop point in time when the first control signal SET is transmitted may be determined. Then, a main read operation of the selected memory cell may be performed by using the target read level of the $12^{th}$ read voltage RD12 and the target develop point in time.

In the third read operation in the section TC, C-EOS reading may be performed by applying the $10^{th}$ read voltage RD10 to the selected word line WL_S, and the number of memory cells obtained as a result of the C-EOS reading may be stored in the MBC 125 of the control circuit 124, thereby approximately searching for the $10^{th}$ valley location. F-EOS reading may be performed by changing a level of the $10^{th}$ read voltage RD10 according to an approximate $10^{th}$ valley location, a target read level of the $10^{th}$ read voltage RD10 according to an accurate $10^{th}$ valley location found as a result of the e-EOS reading, and a target develop point in time when the first control signal SET is transmitted may be determined. Then, a main read operation on the selected memory cell may be performed by using the target read level of the $10^{th}$ read voltage RD10 and the target develop point in time.

Changes in the states S1 to S7 of the memory cells, which are read at lower-level read voltages (e.g., first to seventh read voltages RD1 to RD7) from among 16 states S1 to S16 of the memory cells described with reference to FIG. 12, according to the retention deterioration are small, and thus, shifts of the threshold voltages of the memory cells may be small. On the contrary, the states S8 to S16 of the memory cells read by upper-level read voltages (e.g., the $8^{th}$ to $15^{th}$ read voltages RD8 to RD15) greatly change because of retention deterioration, and thus, the shifts of the threshold voltages of the memory cells may be great. Accordingly, a read operation using the upper-level voltages (e.g., the $8^{th}$ to $15^{th}$ read voltages RD8 to RD15) may use the two-step EOS reading, and a read operation using the lower-level voltages (e.g., first to seventh read voltages RD1 to RD7) may use one-step EOS reading.

In the fourth read operation in the section TD, EOD reading may be performed by applying the $5^{th}$ read voltage RD5 to the selected word line WL_S, a fifth valley location may be searched for by storing the number of memory cells obtained as a result of the EOS reading in the MBC 125 of the control circuit 124, a target read level of the $5^{th}$ read voltage RD5 may be determined according to the fifth valley location, and a target develop point in time when the first control signal SET is transmitted may be determined. Then, a main read operation on the selected memory cell may be performed by using the target read level of the $5^{th}$ read voltage RD5 and the target develop point in time.

Figure 14:
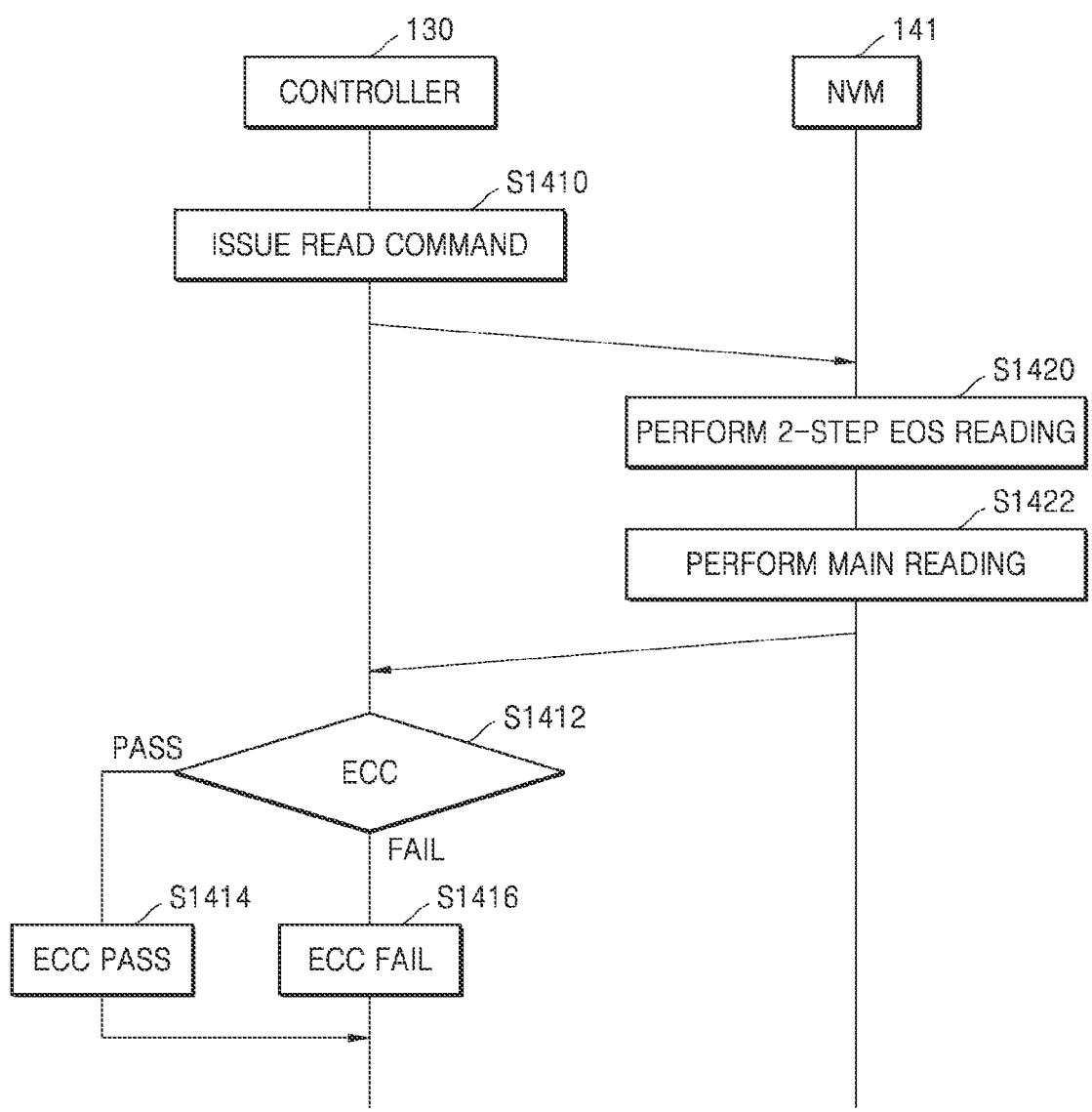
FIGS. 14 and 15 are flowcharts of an operation method of a storage device according to an exemplary embodiment of the inventive concept.
Figure 15:
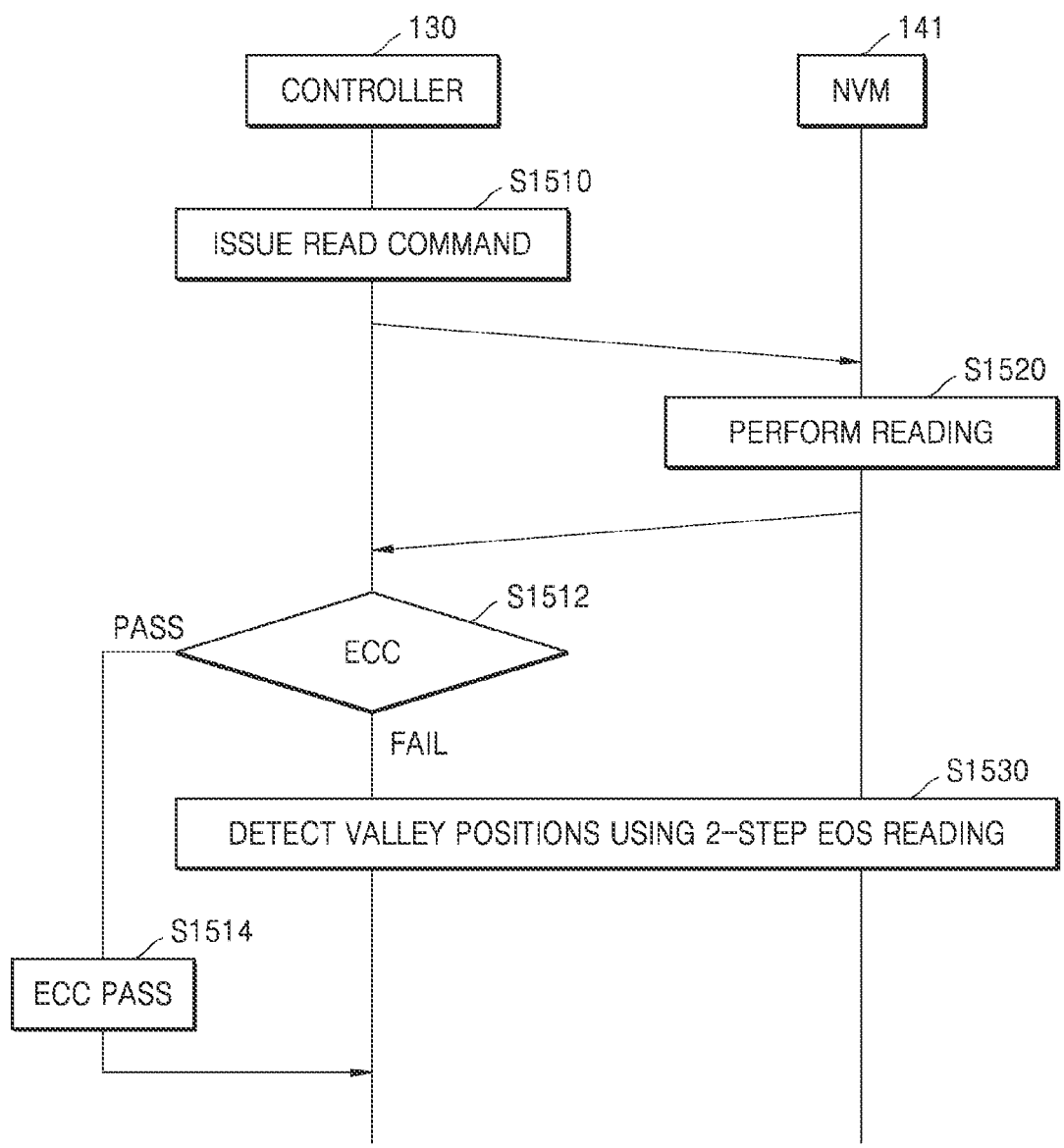

FIGS. 14 and 15 are flowcharts of an operation method of a storage device, according to an exemplary embodiment of the inventive concept. In FIGS. 14 and 15, operations of the controller 130 and the NVM device 141 in the storage device 120 of FIG. 1 will be described.

Referring to FIG. 14, in operation 51410, the controller 150 issues a read command and transmits the read command to the NVM device 141. The NVM device 141 performs a read operation according to the read command.

In operation 51420, the NVM device 141 performs the two-step EOS reading, described with reference to FIGS. 6 to 13, on the selected memory cell. In operation S1422, the NVM device 141 performs a main reading on a selected memory cell by using a target read level and a target develop point in time that were determined as a result of the two-step EOS reading. The NVM device 141 transmits the result of the two-step EOS reading to the controller 130.

In operation 51412, the controller 130 performs an ECC operation on the data output from the NVM device 141 to detect and correct errors. The controller 130 passes the ECC (S1414) when the ECC operation is able to correct the errors or when there are no errors that need to be corrected. The controller 130 determines that the ECC failed (S1416) when it is unable to correct the errors or error correction is not possible. For example, if the number of errors in the data exceed the corrective capability of the ECC operation, error correction may not be possible. The controller 130 may use the ECC unit 131 to perform the ECC operation.

Referring to FIG. 15, in operation 51510, the controller 130 issues a read command and transmits the read command to the NVM device 141.

In operation 51520, the NVM device 141 performs a read operation according to the read command. The NVM device 141 transmits a result of the read operation to the controller 130.

In operation 51512, the controller 130 performs an ECC operation on the data output from the NVM device 141 to detect and correct errors in the data output from the NVM device 141. The controller 130 may perform the ECC operation using the ECC unit 131. The controller 130 passes the ECC in operation 51514 when the ECC operation is able to correct the errors or when there are no errors that need to be corrected. When the error correction is not able to be performed by the controller 130 or the ECC unit 131, operation 51530 is performed.

In operation 51530, the controller 130 performs the two-step EOS reading, described with reference to FIGS. 6 to 13, on the NVM device 141. The controller 130 may deduce optimum read voltages based on locations of valleys obtained as the result of the two-step EOS reading. In an embodiment, locations of valleys are obtained from results of the two-step EOS reading, read voltages are determined from the location of the valleys, and a subsequent read on the NVM device 141 is performed using the determined read voltages.

Figure 16:
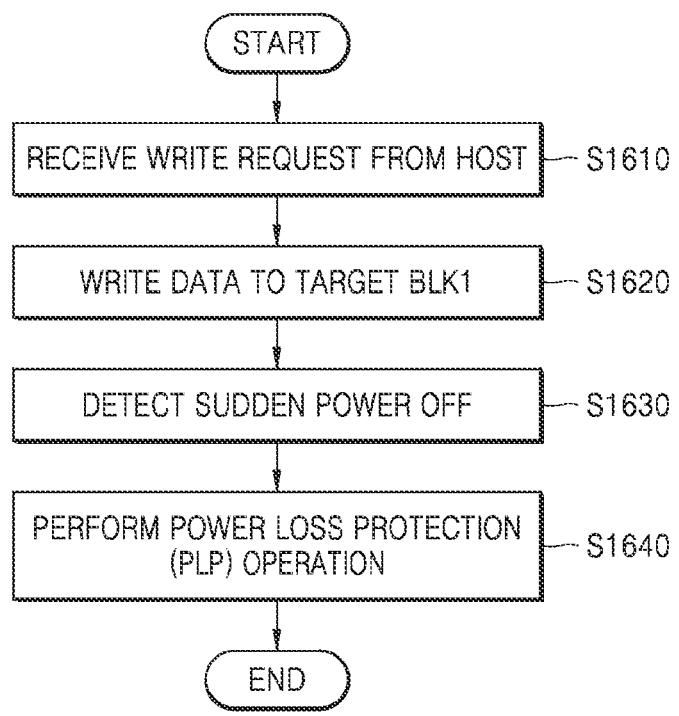
FIG. 16 is a flowchart of an example of an operation method of a storage device of FIG. 1.

FIG. 16 is a flowchart of an operation method of the storage device of FIG. 1 according to an exemplary embodiment of the inventive concept. The operation method of the storage device of FIG. 16 relates to a method of performing a PLP operation due to a sudden power off during the write operation according to a request from the host device 110.

Referring to FIGS. 1 and 15, in operation 51610, the controller 130 of the storage device 120 receives a write request from the host device 110. The host device 110 may transmit a request for storing data in the storage device 120.

In operation S1620, the controller 130 performs a write operation of writing (or programming) data to a target block, for example, the first memory block BLK1, which corresponds to the write request from the host device 110. The controller 130 performs program loops until programming of the data as completed according to Incremental Step Pulse Programming (ISPP). As the number of program loops increases, a program voltage of the selected memory cell may increase in stages.

In operation S1630, the controller 130 detects a sudden power off during the write operation. The controller 130 has to preserve data being written, even when power suddenly turns off.

In operation S1640, the controller 130 performs a PLP operation when power is suddenly turned off in operation S1630. A PLP operation indicates an operation in which a determination regarding whether to successively write data, which is not completely written yet, on the same block on which data is already written, is made when the power is restored, that is, a determination as to whether the successive writing is possible is made, and a data write operation intended by the host device 110 is completed.

For example, the controller 130 may find a last page, on which the data is written, from the block on which the data is being written during the write operation. The controller 130 may check a time, that is, a program time, from a point in time, when the data is written to the last page, to a current point in time. The controller 130 may compare the program time with a reference value and determine whether successive writing is able or unable to be performed. When the reference value is equal to a minimum reference value, the controller 130 may determine that the successive writing is possible when the program time is greater than the minimum reference value and determine that the successive writing is unable to be performed when the program time is less than the minimum reference value. On the contrary, when the reference value is equal to a maximum reference value, the controller 130 may determine that the successive writing is possible when the program time is less than the maximum reference value and determine that the successive writing is unable to be performed when the program time is greater than the maximum reference value. The PLP operation will be described with reference to FIGS. 17 and 18.

Figure 17:
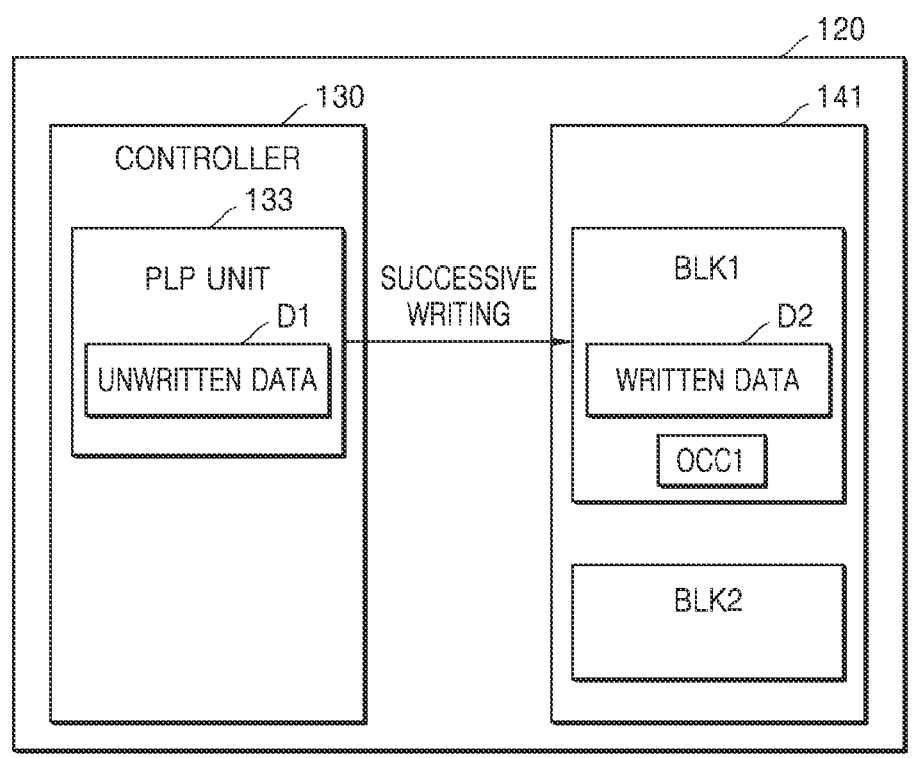
FIGS. 17 to 19 are diagrams of an example of a Power Loss Protection (PLP) operation in operation S1640 of FIG. 16.
Figure 18:
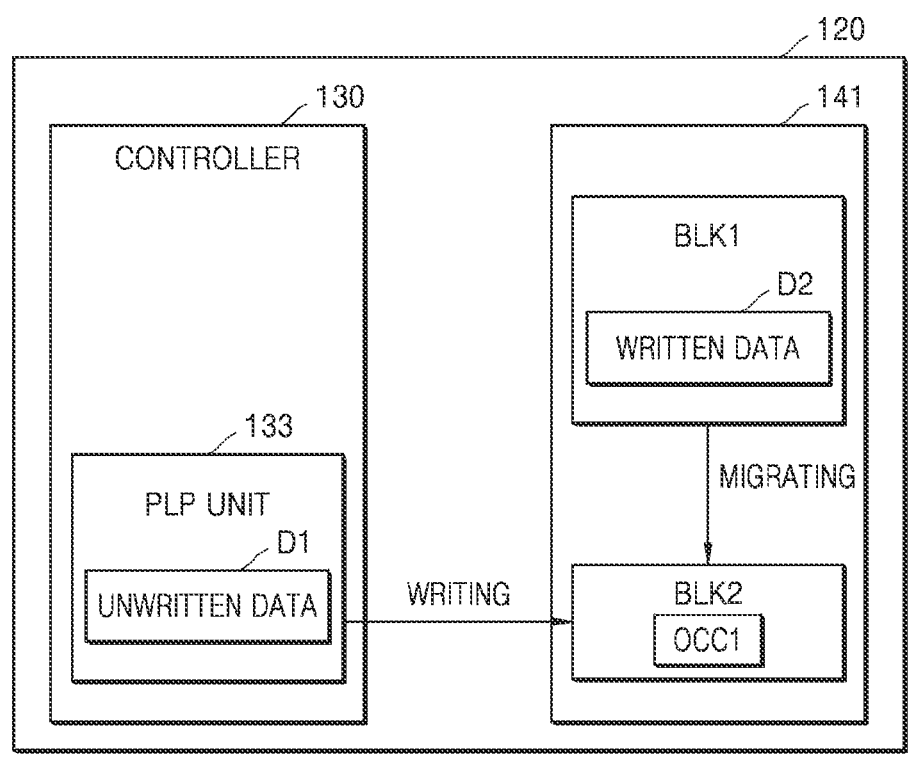
Figure 19:
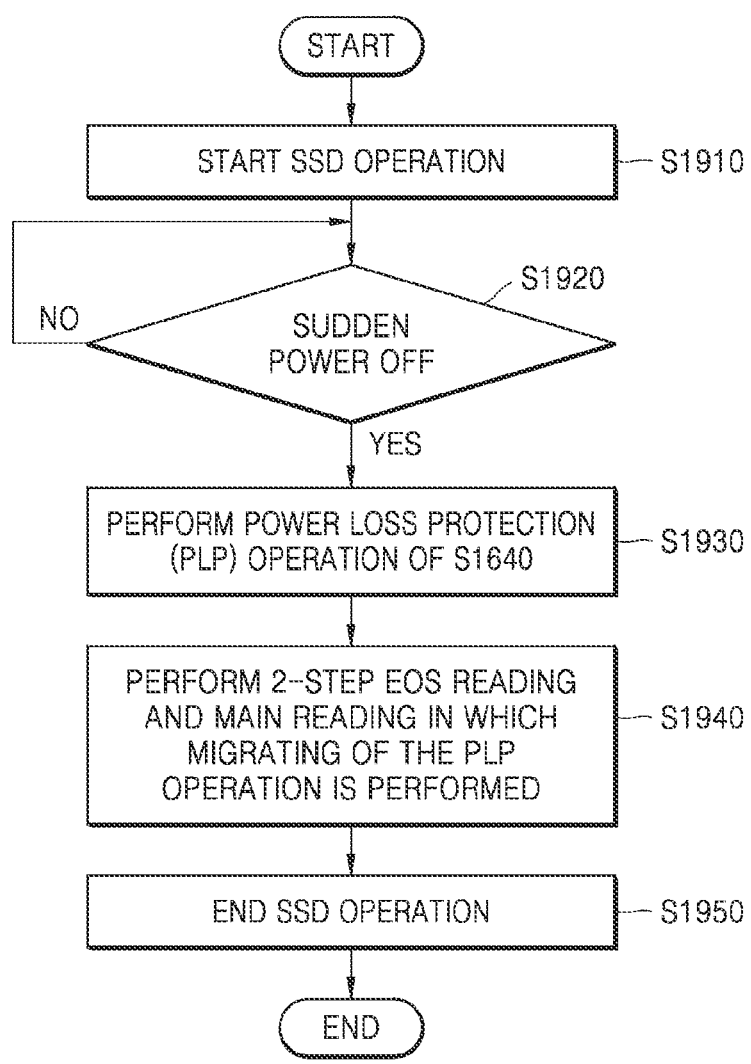

FIGS. 17 to 19 are diagrams for explaining the PLP operation in operation S1640 of FIG. 16. In FIGS. 17 and 18, the NVM device 141 includes the first memory block BLK1 and the second memory block BLK2. The first memory block BLK1 may be a memory block on which the data received from the host device 110 is written, and the second memory block BLK2 may be an empty memory block on which data is not written. FIG. 17 illustrates an operation in which the successive writing is possible, and FIG. 18 illustrates an operation in which the successive writing is unable to be performed.

Referring to FIG. 17, when power suddenly turns off during the write operation, only part of the data DATA is written to the first memory block BLK1, and the remaining part of the data DATA is not written to the first memory block BLK1. The PLP unit 133 of the controller 130 may preserve pieces of the data DATA, which are not written yet, as first data D1 by using auxiliary power. Pieces of the data DATA, which are written to the first memory block BLK1, may be second data D2 and may be in the first memory block BLK1. In the PLP operation, the data DATA of the host device 110 may be separated into the first data D1 and the second data D2.

In the PLP operation, when the controller 130 determines that the successive writing is possible, the first data D1 is successively written to the first memory block BLK1. Thus, the data DATA including the first data D1 and the second data D2 become written to the first memory block BLK1 as intended by the host device 110. Accordingly, a power loss protection purpose may be achieved. In the PLP operation, the first memory block BLK1 may be referred to as a PLP area.

Referring to FIG. 18, in the PLP operation, when the controller 130 determines that the successive writing is unable to be performed, the PLP unit 133 of the controller 130 uses the auxiliary power to write the first data D1 not to the first memory block BLK1 but to the empty second memory block BLK2. The PLP unit 133 migrates the second data D2 in the existing first memory block BLK1 to the second memory block BLK2. Here, the term "migrate" may indicate that data is copied and moved, and thus, the data may still remain in the existing first memory block BLK1 and may be in a new second memory block BLK2. Then, an erase operation may be performed on the first memory block BLK1.

Since the first data D1 and the second data D2 included in the data DATA of the host device 110 are migrated to the second memory block BLK2, the power loss protection purpose may be achieved. In the PLP operation, the first memory block BLK1 may be referred to as the PLP area. In this case, the data DATA is written not to the first memory block BLK1 but to the second memory block BLK2 because of the PLP, unlike the intention of the host device 110. The controller 130 may include a mapping table used to manage mapping between a logical address, which is used by the host device 110, and a physical address, which is used by the NVM device 141 of the non-volatile memory, in a Flash Translation Layer (FTL). The mapping table may be written so that a physical address of the first memory block BLK1 is mapped to a physical address of the second memory block BLK2. Then, a command referencing the first memory block BLK1 designated by the host device 110 may be executed on the second memory block BLK2 by referencing the mapping table. For example, if the data is associated with a logical address, and the logical address is initially mapped to a first physical address of the first block BLK1 in the mapping table, the mapping table may be updated to map the logical address to a second physical address of the second block BLK2 after migrating the data to a location of the second block BL2 having the second physical address.

In FIG. 19, the storage device 120 may be referred to as an SSD.

In operation S1910, the operation of the SSD 120 starts. In operation S1920, the SSD 120 experiences a sudden power off. When the SSD 120 does not experience a sudden power off, the SSD 120 continues performing operation S1910, but when the SSD 120 suddenly powers off, the SSD 120 performs operation S1930.

In operation S1930, the SSD 120 performs the PLP operation as in operation S1640 of FIG. 16 described above. In the PLP operation, the SSD 120 may achieve the power loss protection purpose by using the auxiliary power and performing the successive writing on the first memory block BLK1 as intended by the host when the successive writing is possible, or through writing or migration of data to the second memory block BLK2, which was not intended by the host. In the PLP operation, the first memory block BLK1 or the second memory block BLK2 may be a PLP area.

In operation S1940, when the second data D2 in the existing first memory block BLK1 is moved to the second memory block BLK2, the SSD 120 may perform the two-step EOS reading and main reading described with reference to FIGS. 6 to 13.

In operation 51950, the SSD 120 is powered off, and the operation of the SSD 120 is terminated.

Figure 20:
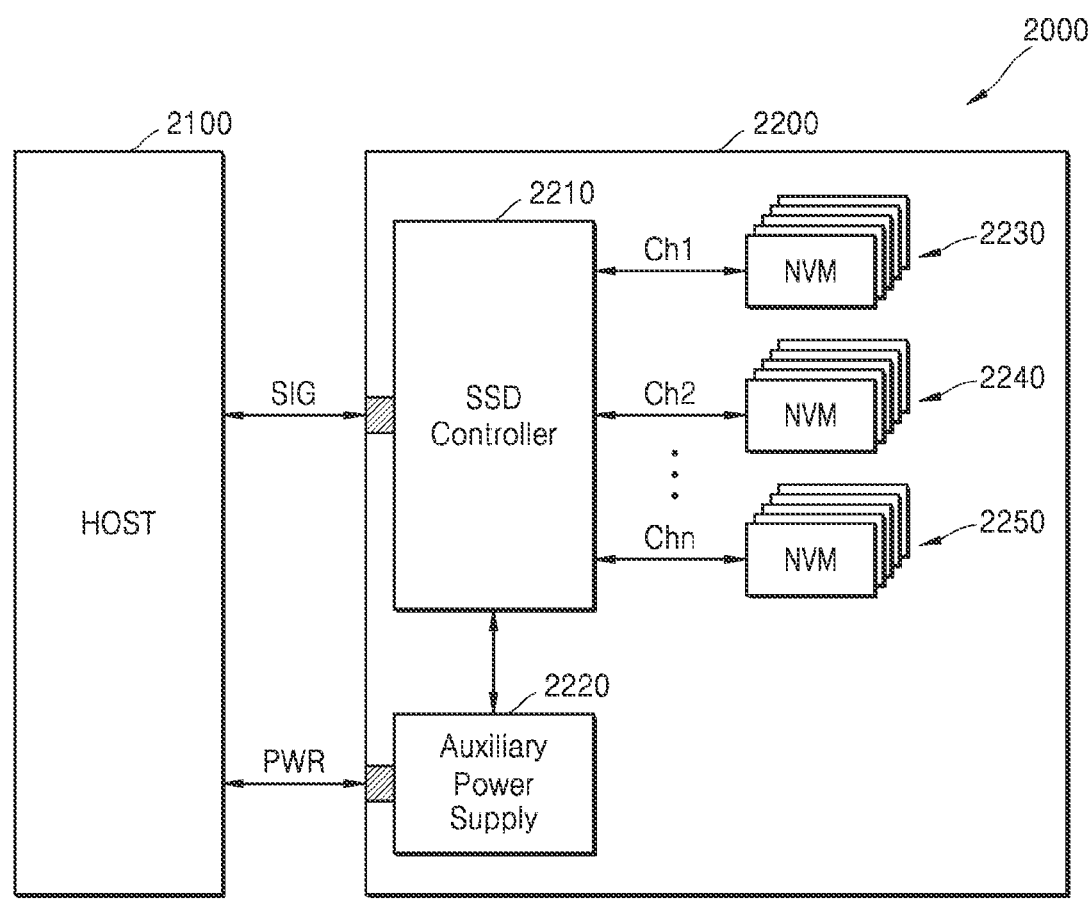
FIG. 20 is a block diagram of an example in which a non-volatile memory is applied to an SSD system, according to an exemplary embodiment of the inventive concept.

FIG. 20 is a block diagram of an example in which a non-volatile memory is applied to an SSD system, according to an exemplary embodiment of the inventive concept.

Referring to FIG. 20, an SSD system 2000 includes a host 2100 and an SSD 2200. The SSD 2200 may exchange signals with the host 2100 through a signal connector and receive power through a power connector. The SSD 2200 includes an SSD controller 2210, an auxiliary power supply 2220, and non-volatile memories 2230, 2240, and 2250. The non-volatile memories 2230, 2240, and 2250 may be vertically stacked NAND flash memory devices. In this case, the SSD 2200 may be realized by using the embodiments described with reference to FIGS. 1 to 19.

While the inventive concept has been particularly shown and described with reference to embodiments thereof, it will be understood that various changes in form and details may be made therein without departing from the spirit and scope of the disclosure.

What is claimed is:

1. A method of reading a non-volatile memory device, the method comprising:
    performing a first main read operation on a selected memory cell among a plurality of memory cells by using a first target read level and a first target develop point in time;
    performing a first sensing operation on the selected memory cell connected to a selected word line and applying a first read voltage to the selected word line, wherein the first sensing operation is performed by separating the plurality of memory cells, which are connected to the selected word line, into a first group and a second group;
    performing a first valley search operation according to a result of the performing of the first sensing operation;
    determining a second target read level of the first read voltage according to a result of the performing of the first valley search operation;
    performing a second sensing operation on the selected memory cell and applying, to the selected word line, a second read voltage having a different target read level from the first read voltage, wherein the second sensing operation is performed by separating the plurality of memory cells into the first group and the second group;
    performing a second valley search operation according to a result of the performing of the second sensing operation;
    determining a second target develop point in time for setting the voltage level of a sensing node connected to the selected memory cell, according to a result of the performing of the second valley search operation; and
    performing a second main read operation on the selected memory cell by using the second target read level and the second target develop point in time.

2. The method of claim 1, wherein the first group of the plurality of memory cells comprises a plurality of even page buffers connected to a plurality of even bit lines from among a plurality of bit lines of the plurality of memory cells, and
    the second group of the plurality of memory cells comprises a plurality of odd page buffers connected to a plurality of odd bit lines from among the plurality of bit lines of the plurality of memory cells.

3. The method of claim 2, wherein the performing of the first sensing operation and the performing of the second sensing operation each comprise performing an even reading operation of latching a voltage level of a sensing node connected to the plurality of even page buffers and then performing an odd reading operation of latching a voltage level of a sensing node connected to the plurality of odd page buffers.

4. The method of claim 2, wherein the performing of the first sensing operation and the performing of the second sensing operation each comprise performing an odd reading operation of latching a voltage level of a sensing node connected to the plurality of odd page buffers and then performing an even reading operation of latching a voltage level of a sensing node connected to the plurality of even page buffers.

5. The method of claim 1, wherein, in the performing of the second sensing operation, the second read voltage, which is applied to the selected word line, is changed n times, and the second sensing operation is performed the n times, where n a number equal to or greater than 3.

6. A method of reading data from a selected memory cell of a non-volatile memory device comprising a plurality of memory cells, the method comprising:
    performing a two-step Even Odd Sensing (EOS) operation on the selected memory cell;
    performing a first main sensing operation on the selected memory cell, according to a result of the two-step EOS operation;
    performing a one-step EOS operation on the selected memory cell; and
    performing a second main sensing operation on the selected memory cell, according to a result of the one-step EOS operation,
    wherein the two-step EOS operation is performed to identify program states that have shifted more than a first threshold amount according to a retention deterioration from among program states of the plurality of memory cells, and the one-step EOS operation is performed to identify program states that have shifted less than a second threshold amount according to the retention deterioration from among the program states of the plurality of memory cells.

7. The method of claim 6, wherein the performing of the two-step EOS operation comprises performing a first sensing operation on the selected memory cell and applying a first read voltage to a selected word line connected to the selected memory cell, wherein the first sensing operation is performed by separating a plurality of the memory cells, which are connected to the selected word line, into a first group and a second group;
    determining a first valley search operation and a target read level of the first read voltage according to a result of the performing of the first sensing operation;
    performing a second sensing operation on the selected memory cell and applying, to the selected word line, a second read voltage having a different target read level from the first read voltage, wherein the second sensing operation is performed by separating the plurality of memory cells into the first group and the second group;
    performing a second valley search operation according to a result of the performing of the second sensing operation; and
    determining a target develop point in time of a sensing node connected to the selected memory cell, according to a result of the performing of the second valley search operation.

8. The method of claim 7, wherein the performing of the first main sensing operation comprises performing a read operation on the selected memory cell by using the target read level and the target develop point in time.

9. The method of claim 7, wherein the first group of the plurality of memory cells comprises a plurality of even page buffers connected to a plurality of even bit lines from among a plurality of bit lines of the plurality of memory cells, and the second group of the plurality of memory cells comprises a plurality of odd page buffers connected to a plurality of odd bit lines from among the plurality of bit lines of the plurality of memory cells.

10. The method of claim 9, wherein the performing of the first sensing operation and the performing of the second sensing operation each comprise performing an even reading operation of latching a voltage level of a sensing node connected to the plurality of even page buffers and then performing an odd reading operation of latching a voltage level of a sensing node connected to the plurality of odd page buffers.

11. The method of claim 9, wherein the performing of the first sensing operation and the performing of the second sensing operation each comprise performing an odd reading operation of latching a voltage level of a sensing node connected to the plurality of odd page buffers and then performing an even reading operation of latching a voltage level of a sensing node connected to the plurality of even page buffers.

12. The method of claim 7, wherein, in the performing of the second sensing operation, the second read voltage, which is applied to the selected word line, is changed n times, and the second sensing operation is performed the n times, where n is a number equal to or greater than 3.

13. An operation method of a storage device comprising a non-volatile memory device and a controller that controls the non-volatile memory device, the method comprising:
transmitting a read command from the controller to the non-volatile memory device;
performing a read operation on the non-volatile memory device according to the read command and transmitting read data of the read operation to the controller;
performing, by the controller, an Error Correction Code (ECC) operation on the read data;
performing a two-step Even Odd Sensing (EOS) operation on the non-volatile memory device when a result of the ECC operation indicates error correction of the read data is not possible; and
determining optimum read levels of a valley for reading data stored in a plurality of memory cells of the non-volatile memory device, according to a result of the performing of the two-step EOS operation.

14. The operation method of claim 13, wherein the performing of the two-step EOS operation comprises:
performing a first sensing operation on a selected memory cell from among the plurality of memory cells and applying a first read voltage to a selected word line connected to the selected memory cell, wherein the first sensing operation is performed by separating the plurality of memory cells, which are connected to the selected word line, into a first group and a second group;
determining a first valley search and a target read level of the first read voltage, according to a result of the performing of the first sensing operation;
performing a second sensing operation on the selected memory cell and applying, to the selected word line, a second read voltage having a different target read level from the first read voltage, wherein the second sensing operation is performed by separating the plurality of memory cells into the first group and the second group;
performing a second valley search operation according to a result of the performing of the second sensing operation; and
determining a target develop point in time of a sensing node connected to the selected memory cell, according to a result of the performing of the second valley search operation.

15. The operation method of claim 14, wherein the first group of the plurality of memory cells comprises a plurality of even page buffers connected to a plurality of even bit lines from among a plurality of bit lines of the plurality of memory cells, and
the second group of the plurality of memory cells comprises a plurality of odd page buffers connected to a plurality of odd bit lines from among the plurality of bit lines of the plurality of memory cells.

16. The operation method of claim 15, wherein the performing of the first sensing operation and the performing of the second sensing operation comprise performing an even reading operation of latching a voltage level of a sensing node connected to the plurality of even page buffers and then performing an odd reading operation of latching a voltage level of a sensing node connected to the plurality of odd page buffers.

17. The operation method of claim 15, wherein the performing of the first sensing operation and the performing of the second sensing operation comprise performing an odd reading operation of latching a voltage level of a sensing node connected to the plurality of odd page buffers and then performing an even reading operation of latching a voltage level of a sensing node connected to the plurality of even page buffers.

18. The operation method of claim 14, wherein, in the performing of the second sensing operation, the second read voltage, which is applied to the selected word line, is changed n times, and the second sensing operation is performed the n times, where n is a number equal to or greater than 3.

* * * * *